(12) United States Patent
Yamaguchi et al.

(10) Patent No.: US 8,705,257 B2
(45) Date of Patent: Apr. 22, 2014

(54) SWITCHING MODULE INCLUDING A SNUBBER CIRCUIT CONNECTED IN PARALLEL TO A SERIES-CONNECTED UNIT OF FLOWING RESTRICTION ELEMENTS

(75) Inventors: Nobuhisa Yamaguchi, Toyokawa (JP); Yasuyuki Sakai, Kariya (JP)

(73) Assignee: Denso Corporation, Kariya (JP)

( * ) Notice: Subject to any disclaimer, the term of this patent is extended or adjusted under 35 U.S.C. 154(b) by 223 days.

(21) Appl. No.: 13/287,246

(22) Filed: Nov. 2, 2011

(65) Prior Publication Data

US 2012/0106220 A1    May 3, 2012

(30) Foreign Application Priority Data

Nov. 3, 2010 (JP) ................................. 2010-246926
Aug. 9, 2011 (JP) ................................. 2011-173686

(51) Int. Cl.
*H02H 7/122* (2006.01)
*H02M 7/5387* (2007.01)
*H01L 23/52* (2006.01)

(52) U.S. Cl.
USPC ......................... 363/132; 363/56.12; 257/691

(58) Field of Classification Search
USPC ............ 363/132, 56.02, 56.12; 361/113, 118; 257/691
See application file for complete search history.

(56) References Cited

U.S. PATENT DOCUMENTS

| 6,377,461 | B1 | 4/2002 | Ozmat et al. | |
| 7,738,226 | B2 * | 6/2010 | Berberich et al. | ........... 361/91.7 |
| 2001/0005322 | A1 | 6/2001 | Uchida | |
| 2001/0033477 | A1 | 10/2001 | Inoue et al. | |
| 2002/0192442 | A1 | 12/2002 | Kondo et al. | |
| 2003/0090873 | A1 | 5/2003 | Ohkouchi | |
| 2004/0091687 | A1 | 5/2004 | Kondo et al. | |
| 2004/0100778 | A1 | 5/2004 | Vinciarelli et al. | |

(Continued)

FOREIGN PATENT DOCUMENTS

| JP | 03-253265 | 11/1991 |
| JP | 07-007924 | 1/1995 |

(Continued)

OTHER PUBLICATIONS

Information Offer Form (8 pages) dated Mar. 27, 2013, submitted in corresponding Japanese Application No. 2011-173686 and English translation (12 pages).

(Continued)

*Primary Examiner* — Bao Q Vu
*Assistant Examiner* — Zekre Tsehaye
(74) *Attorney, Agent, or Firm* — Nixon & Vanderhye P.C.

(57) ABSTRACT

A switching module includes a series-connected unit of a first flowing restriction element and a second flowing restriction element, the first flowing restriction element having an opening and closing function of opening and closing a flowing path of current, and the second flowing restriction element having at least one of a rectifying function of restricting the direction in which current flows and the opening and closing function, and a snubber circuit connected to the series-connected unit in parallel. A first wiring line connecting between the first flowing restriction element and the snubber circuit, a second wiring line connecting between the second flowing restriction element and the snubber circuit, a third wiring line connecting between the first flowing restriction element and the second flowing restriction element, the first flowing restriction element, the second flowing restriction element, and the snubber circuit are formed substantially integrally with each other by using an insulator.

16 Claims, 16 Drawing Sheets

(56) References Cited

U.S. PATENT DOCUMENTS

| | | |
|---|---|---|
| 2004/0144996 A1 | 7/2004 | Inoue |
| 2004/0218318 A1 | 11/2004 | Bijlenga et al. |
| 2005/0040515 A1 | 2/2005 | Inoue et al. |
| 2005/0146027 A1 | 7/2005 | Kondou et al. |
| 2006/0120047 A1 | 6/2006 | Inoue |
| 2006/0152085 A1* | 7/2006 | Flett et al. .................. 307/75 |
| 2006/0232939 A1 | 10/2006 | Inoue |
| 2008/0112139 A1 | 5/2008 | Vinciarelli et al. |
| 2009/0250781 A1 | 10/2009 | Kondou et al. |
| 2009/0257212 A1* | 10/2009 | Takano et al. ................. 361/784 |
| 2010/0109052 A1 | 5/2010 | Nakajima et al. |
| 2011/0181993 A1 | 7/2011 | Yamaguchi |

FOREIGN PATENT DOCUMENTS

| | | |
|---|---|---|
| JP | 2011-177005 | 9/2001 |
| JP | 2001-308263 | 11/2001 |
| JP | 2002-119055 | 4/2002 |
| JP | 2002-141464 | 5/2002 |
| JP | P3366192 | 11/2002 |
| JP | 2003-017859 | 1/2003 |
| JP | 2004-193476 * | 7/2004 |
| JP | 2004-215491 | 7/2004 |
| JP | 2004-524796 | 8/2004 |
| JP | 2005-197435 | 7/2005 |
| JP | P3747931 | 12/2005 |
| JP | P4009901 | 9/2007 |
| JP | P4455914 | 2/2010 |
| JP | 2010-183765 | 8/2010 |
| JP | 2010-205960 * | 9/2010 |
| JP | 2010-267944 | 11/2010 |

OTHER PUBLICATIONS

Office Action (3 pages) dated May 21, 2013, issued in corresponding Japanese Application No. 2011-173686 and English translation (4 pages).

Transistor Technology Special No. 54, Mar. 25, 2013—see Information Offer form for English explanation.

Designing a practical circuit of an inverter and driving software, Mar. 25, 2013—see Information Offer form for English explanation.

Transistor Technology Special No. 54, Aug. 1, 2000—see Information Offer form for English explanation.

Designing a practical circuit of an inverter and driving software, Mar. 18, 1996—see Information Offer form for English explanation.

* cited by examiner

US 8,705,257 B2

SWITCHING MODULE INCLUDING A SNUBBER CIRCUIT CONNECTED IN PARALLEL TO A SERIES-CONNECTED UNIT OF FLOWING RESTRICTION ELEMENTS

CROSS-REFERENCE TO RELATED APPLICATION

This application is based on and claims the benefit of priority from earlier Japanese Patent Applications No. 2010-246926 filed Nov. 3, 2010 and No. 2011-173686 filed Aug. 9, 2011, the descriptions of which are incorporated herein by reference.

BACKGROUND

1. Technical Field

The present invention relates to a switching module which includes a series-connected unit of a first flowing restriction element and a second flowing restriction element and a snubber circuit connected to the series-connected unit in parallel, the first flowing restriction element having an opening and closing function of opening and closing a flowing path of current, and the second flowing restriction element having at least one of a rectifying function of restricting the direction in which current flows and the opening and closing function.

2. Related Art

Generally, a power converter circuit generates high-frequency noise due to the change of a switching state of a switching element. For example, Japanese Patent No. 4455914 discloses a measure against the high-frequency noise. In this configuration, a conductor connected to a collector of a high-potential-side IGBT (insulated gate bipolar transistor) and a conductor connected to an emitter of a low-potential-side IGBT are opposed to each other, and a conductor connected to an emitter of the high-potential-side IGBT and a conductor connected to a collector of the low-potential-side IGBT are opposed to each other. Hence, the direction in which a current flows when the high-potential-side IGBT is turned on can be contrary to the direction in which a recovery current of a diode connected to the low-potential-side IGBT in anti-parallel flows. Consequently, parasitic inductance of the above conductors can be restrained, which decreases surge voltage.

However, since the structure of the above conductors is variously restricted by the cooling structure of the switching element, current capacities of the conductors and the like, the shape cannot easily be changed.

SUMMARY

An embodiment provides a switching module which includes a series-connected unit of a first flowing restriction element and a second flowing restriction element and a snubber circuit connected to the series-connected unit in parallel, the first flowing restriction element having an opening and closing function of opening and closing a flowing path of current, and the second flowing restriction element having at least one of a rectifying function of restricting the direction in which current flows and the opening and closing function.

As an aspect of the embodiment, a switching module is provided which includes: a first series-connected unit of a first flowing restriction element and a second flowing restriction element, the first flowing restriction element having an opening and closing function of opening and closing a flowing path of current, and the second flowing restriction element having at least one of a rectifying function of restricting the direction in which current flows and the opening and closing function; and a snubber circuit connected to the first series-connected unit in parallel, wherein a first wiring line connecting between the first flowing restriction element and the snubber circuit, a second wiring line connecting between the second flowing restriction element and the snubber circuit, a third wiring line connecting between the first flowing restriction element and the second flowing restriction element, the first flowing restriction element, the second flowing restriction element, and the snubber circuit are formed substantially integrally with each other by using an insulator.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

(First Embodiment)

In the first embodiment, a switching module of an inverter is connected to a rotating machine used as a vehicle traction unit.

Figure 1:
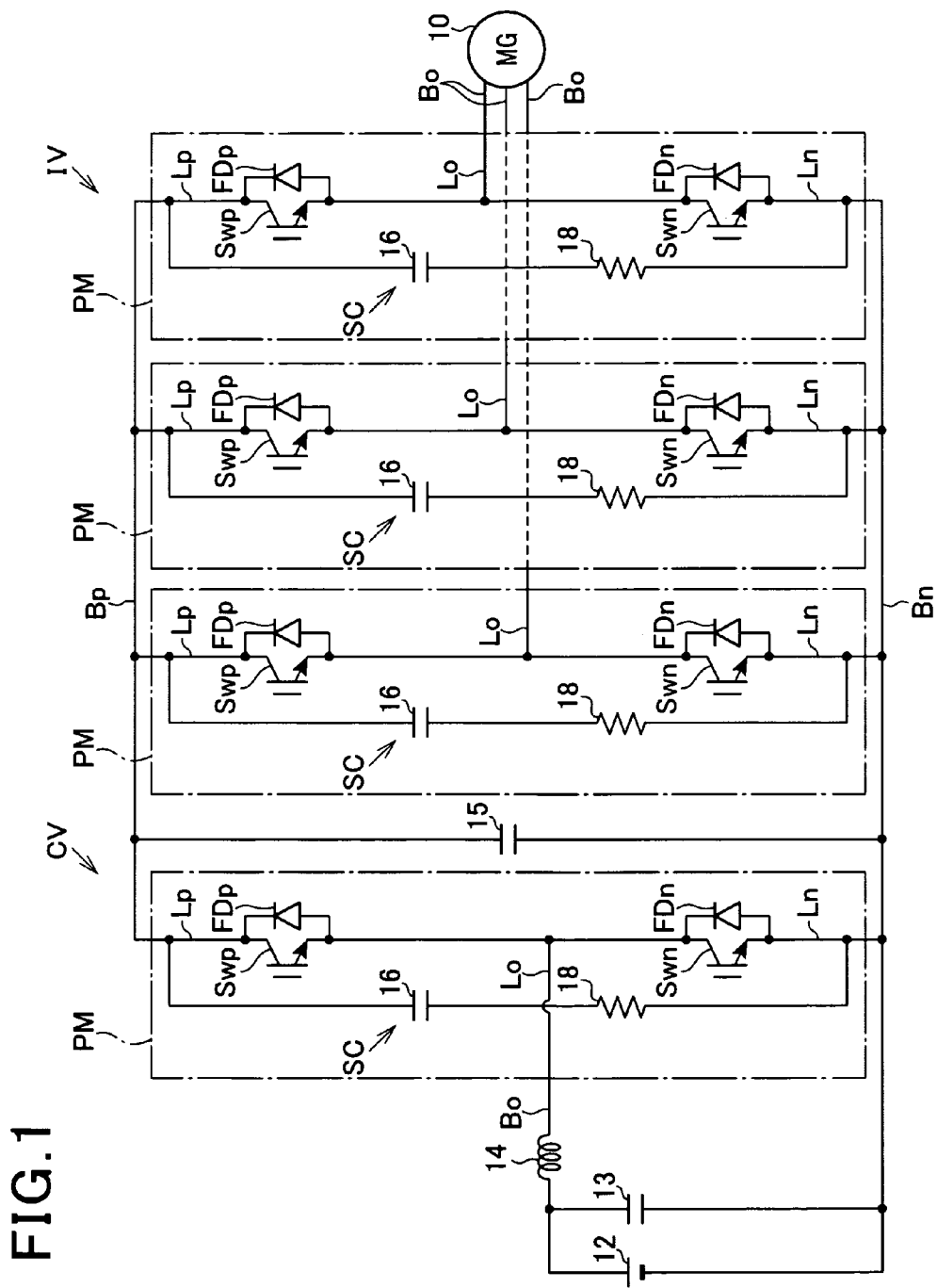
FIG. 1 is a diagram showing a system configuration according to a first embodiment.

FIG. 1 is a general configuration of a control system according to the present embodiment. A motor/generator 10 is a vehicle traction unit and is mechanically connected to drive wheels (not shown). The motor/generator 10 is connected to a smoothing capacitor 13 and a high-voltage battery 12 via an inverter IV and a step-up converter CV. The step-up converter CV includes a capacitor 15, a pair of switching elements Swp, Swn, and a reactor 14. The pair of switching elements Swp, Swn is connected to the capacitor 15 in parallel. The reactor 14 connects between the connecting point of the pair of switching elements Swp, Swn and the positive electrode of the high-voltage battery 12. By turning on and off the switching elements Swp, Swn, the voltage of the high-voltage battery 12 having high terminal voltage, for example, equal to or more than 100V (e.g. 288V) is increased within a predetermined upper limit (e.g. 650V). Meanwhile, the inverter IV includes three series-connected units of the switching elements Swp, Swn. The connecting points of the series-connected units are respectively connected to U, V, W phases of the motor/generator 10. In the present embodiment, IGBTs (insulated gate bipolar transistors) are used as the switching elements Swp, Swn. Free wheel diodes FDp, FDn are connected to the switching elements Swp, Swn in anti-parallel. A pair of the switching element Swp and the free wheel diode FDp connected to each other in anti-parallel and a pair of the switching element Swn and the free wheel diode FDn connected to each other in anti-parallel are flowing restriction elements.

The series-connected unit of the high-potential-side switching element Swp and the low-potential-side switching element Swn is connected with a snubber circuit SC in parallel which is a series-connected unit of a capacitor 16 and a resistor 18. The series-connected unit of the high-potential-side switching element Swp and the low-potential-side switching element Swn and the snubber circuit SC configure a power module PM.

High-potential-side lines Lp connected to the high-potential-side switching elements Swp of the power module PM are connected to a high-potential-side input terminal of the inverter IV via a high-potential-side bus bar Bp. Low-potential-side lines Ln connected to the low-potential-side switching elements Swn of the power module PM are connected to a low-potential-side input terminal of the inverter IV via a low-potential-side bus bar Bn. Each intermediate line Lo, which is connected to the connecting point of the high-potential-side switching element Swp and the low-potential-side switching element Swn, of each of the power modules PM of the inverter IV is connected to each bus bar Bo which is connected to each phase of the motor/generator 10. One intermediate line Lo of the converter CV is connected to the bus bar Bo which is connected to the reactor 14.

The snubber circuit SC forms a path, in which the amount of the current varies with the change of the switching state of the switching elements Swp, Swn, into a short loop. Hereinafter, this configuration is explained by giving an example in which a state where the high-potential-side switching element Swp of the inverter IV is ON and the low-potential-side switching element Swn is OFF changes to a state where the high-potential-side switching element Swp is OFF and the low-potential-side switching element Swn is ON. In this example, when the snubber circuit SC is not provided, current of the high-potential-side bus bar Bp decreases and current of the low-potential-side bus bar Bn increases. However, voltage is generated which prevents the variation in current due to parasitic inductance of the bus bar Bp, Bn. In contrast, when the snubber circuit SC is provided, due to the change of the switching state, the current which has flowed to the high-potential-side bus bar Bp flows into a positive electrode terminal of the capacitor 16, and the current which has flowed from a negative electrode terminal of the capacitor 16 flows into the free wheel diodes FDn. Hence, the sudden variation in current of the high-potential-side bus bar Bp and the low-potential-side bus bar Bn is moderated, which can decrease the voltage caused by the parasitic inductance of the bus bars Bp, Bn.

Note that even when the snubber circuit SC is provided, the current in the loop circuit, which is formed of the series-connected unit of the high-potential-side switching element Swp and the low-potential-side switching element Swn and the snubber circuit SC, is easily varied with the change of the switching state. Then, surge due to parasitic inductance in the loop circuit and radiation noise due to the variation in current are generated.

To restrict the surge and the radiation noise, in the present embodiment, the loop circuit including the series-connected unit of the high-potential-side switching element Swp and the low-potential-side switching element Swn and the snubber circuit SC is formed on a printed circuit board (multilayer board), whereby the loop circuit can be sufficiently small.

Figure 2:
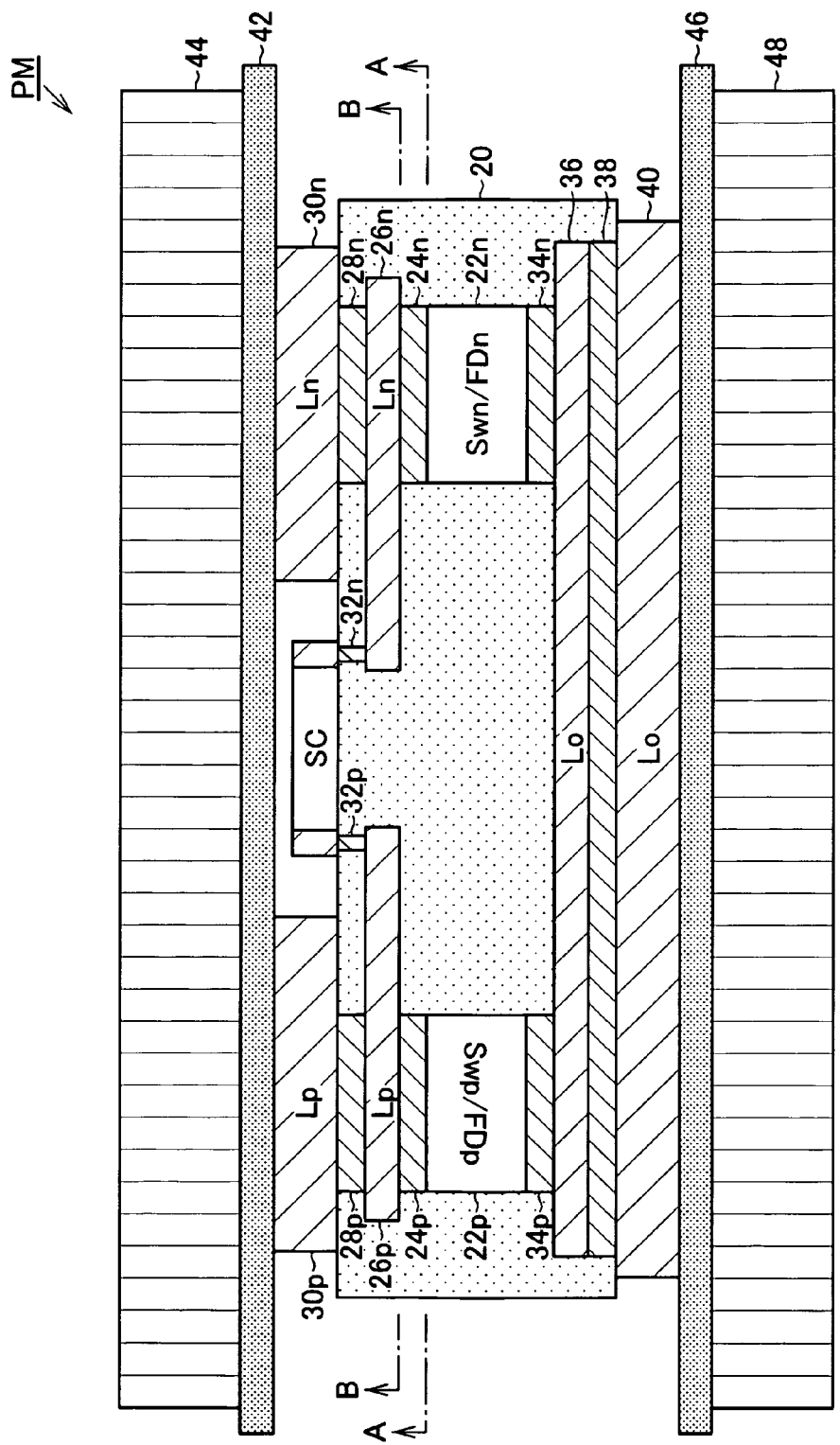
FIG. 2 is a sectional view showing a configuration of a power module according to the first embodiment.

FIG. 2 is a sectional view showing a configuration of the power module PM according to the present embodiment.

In the present embodiment, the high-potential-side switching element Swp and the low-potential-side switching element Swn are embedded in the same layer of the multilayer board 20. Specifically, a semiconductor chip 22p and a semiconductor chip 22n are arranged in a state where the semiconductor chip 22p and the semiconductor chip 22n are insulated from each other in the layer. Both the high-potential-side switching element Swp and the low-potential-side switching element Swn are vertical devices. Emitters and switching control terminals (gates) of the high-potential-side switching element Swp and the low-potential-side switching element Swn are formed on respective first surfaces of the semiconductor chips 22p, 22n. Collectors are formed on respective second surfaces opposed to the first surfaces of the semiconductor chips 22p, 22n. In FIG. 2, the labeling of the semiconductor chips 22p, 22n are represented so as to be inverted from each other. This shows that the arrangement of one surface and another surface opposed to the one surface of the semiconductor chip 22p is inverted from that of the semiconductor chip 22n. Free wheel diodes FDp, FDn are formed in the semiconductor chips 22p, 22n. Note that, in FIG. 2, the switching element Swp and the free wheel diode FDp are represented in the same semiconductor chip 22p and the switching element Swn and the free wheel diode FDn are represented in the same semiconductor chip 22n. However, this representation is a matter of convenience. This representation does not imply that the switching element Swp and the free wheel diode FDp are arranged on the same semiconductor substrate and the switching element Swn and the free wheel diode FDn are arranged on the same semiconductor substrate.

Figure 3A:
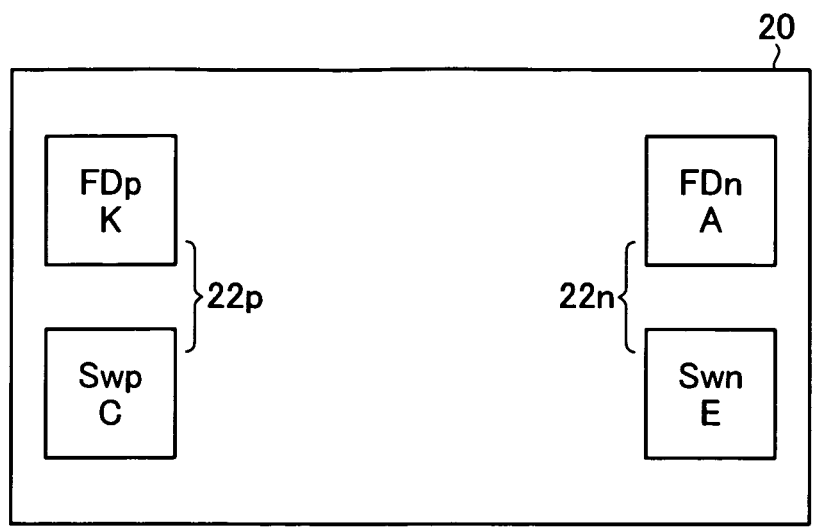
FIGS. 3A and 3B are other sectional views showing a configuration of the power module according to the first embodiment.
Figure 3B:
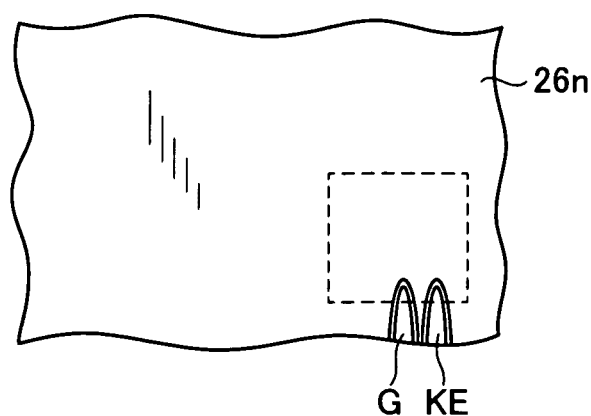

The surface of the semiconductor chip 22p, on which a collector and a cathode are formed, is connected to a wiring layer 26p forming the high-potential-side wiring Lp via a via conductor 24p. The surface of the semiconductor chip 22n, on which an emitter, a gate, and an anode are formed, is connected to a wiring layer 26n forming the low-potential-side wiring Ln via a via conductor 24n. The wiring layers 26p, 26n form the same layer (wiring layer). In the wiring layer 26n, a portion which is connected to an emitter and an anode and a portion which is connected to a gate are insulated from each other. FIG. 3A is an A-A sectional view of FIG. 2, and FIG. 3B is a part of a B-B sectional view of FIG. 2. FIG. 3B shows not only a state where the gate of the semiconductor chip 22n (the wiring connected to the gate is represented as "G") is insulated from the emitter but also a state where a Kelvin emitter electrode (the part connected to the Kelvin emitter electrode is represented as "KE"). Note that the Kelvin emitter electrode is a terminal which has the same electric potential as that of the emitter of IGBT but does not output a large current. The Kelvin emitter electrode generates a reference potential of a drive circuit of the switching elements Swp, Swn. The wiring part insulated from the emitter is not limited to a part which is connected to the Kelvin emitter electrode or the gate. The wiring part may include a part which is connected to a given terminal (electrode) connected to the driving circuit side, such as a part connected to a sense terminal which outputs a minute electric current having correlation with a current flowing between a pair of the terminals of the switching element Swp.

The wiring layers 26p and 26n respectively form the high-potential-side line Lp and the low-potential-side line Ln. The wiring layer 26p is connected to the snubber circuit SC formed on the surface of a multilayer board 20 via a via conductor 32p. In addition, the wiring layer 26n is connected to the snubber circuit SC via a via conductor 32n formed in the same layer as that of the via conductor 32p. Note that the snubber circuit SC is arranged so as to run in parallel with the electric path connecting between the wiring layers 26p and 26n at the shortest distance. In addition, the lengths of the via conductors 32p and 32n, which are connection means between the wiring layers 26p, 26n and the snubber circuit SC, are sufficiently shorter than the interval between the connecting point of the via conductor 32p and the wiring layer 26p and the connecting point of the via conductor 32n and the wiring layer 26n. Hence, the wiring layers 26p, 26n are connected to each other by the snubber circuit SC. In this case, the length of the connection path is as long as that of the snubber circuit SC.

The wiring layer 26p is connected to a conductor 30p via a via conductor 28p. The portion of the wiring layer 26n to which the emitter and the anode of the semiconductor chip 22n are connected is connected to a conductor 30n via a via conductor 28n. The conductors 30p and 30n not only form the high-potential-side line Lp and the low-potential-side line Ln but also have a function of a heat spreader for diffusing the heat generated from the semiconductor chips 22p, 22n. The function of the heat spreader is realized when the surface areas of the conductors 30p, 30n are larger than the surface areas of the semiconductor chips 22p, 22n and the heights of the conductors 30p, 30n are sufficiently ensured. Note that the heights of the conductors 30p, 30n are equal to or more than the height of the snubber circuit SC.

Meanwhile, the surface of the semiconductor chip 22p on which the emitter and the anode are formed is connected to a wiring layer 36 forming the intermediate line Lo via a via conductor 34p. The surface of the semiconductor chip 22n on which the collector and the cathode are formed is connected to the wiring layer 36 forming the intermediate line Lo via a via conductor 34n. In the wiring layer 36, a portion which is connected to the Kelvin emitter electrode and the gate of the semiconductor chip 22p and a portion which is connected to the emitter are insulated from each other.

A portion of the wiring layer 36, to which the emitter and the anode of the semiconductor chip 22p and the semiconductor chip 22n are connected, is connected to a conductor 40 formed on the surface of the multilayer board 20 via a via conductor 38. The conductor 40 not only forms the intermediate line Lo but also has a function of a heat spreader for diffusing the heat generated from the semiconductor chips 22p, 22n. The function of the heat spreader is realized when the surface area of the conductor 40 is larger than the surface areas of the semiconductor chips 22p, 22n and the height of the conductor 40 is sufficiently ensured.

The heat generated from the conductors 30p, 30n is radiated to a heat sink 44 through an insulating film 42. The heat generated from the conductor 40 and the heat diffused into the conductor 40 are radiated to a heat sink 48 through an insulating film 46. The insulating films 42, 46 preferably have as high heat conductivity as possible. For example, the insulating films 42, 46 may be made of ceramic, an insulating film or the like. Note that the multilayer board 20 may be a thermoplastic resin film multilayered by thermal pressing.

According to the above configuration, the current path between the snubber circuit SC and the semiconductor chip 22p is opposed to the current path between the semiconductor chip 22p and the wiring layer 36, and the directions in which currents flow in the two current paths are opposite to each other. Thereby, the inductance of the paths can be reduced. Similarly, the current path between the snubber circuit SC and the semiconductor chip 22n is opposed to the current path between the semiconductor chip 22n and the wiring layer 36, and the directions in which currents flow in the two current paths are opposite to each other. Thereby, the inductance of the paths can be reduced. In addition, the current path, in which current (high-frequency current) varies with the change of the switching state of the high-potential-side switching element Swp and the low-potential-side switching element Swn, can be formed into a short loop. That is, in this case, the current path is a loop path formed of the snubber circuit SC, the wiring layer 26p, the semiconductor chip 22p, the wiring layer 36, the semiconductor chip 22n and the wiring layer 26n, and is a very small path which is defined by the thickness of the multilayer board 20. Hence, even when the high-frequency current flows through the path, surge and radiation noise due to the high-frequency current can sufficiently be prevented.

Figure 4:
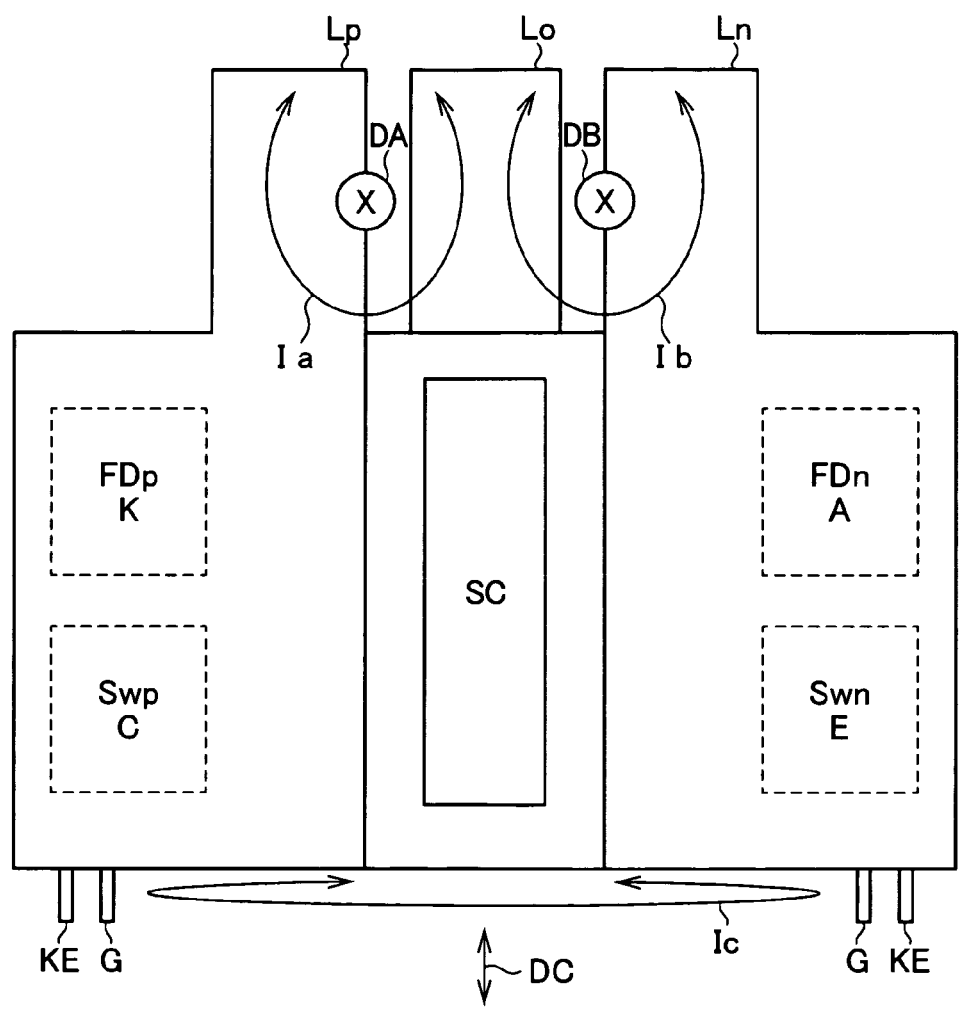
FIG. 4 is another sectional view showing a configuration of the power module according to the first embodiment.

In addition, in the present embodiment, as shown in FIG. 4 which is the B-B sectional view of FIG. 2, the high-potential-side line Lp connected to the high-potential-side bus bar Bp, the intermediate line Lo connected to the bus bar Bo, and the low-potential-side line Ln connected to the low-potential-side bus bar Bn are formed so as to be parallel with a pair of surfaces of the multilayer board 20 to which emitters and collectors of the semiconductor chips 22p, 22n are connected. Hence, the path through which the high-frequency current flows is orthogonal to the current path between the high-potential-side line Lp and the intermediate line Lo and the current path between the low-potential-side line Ln and the intermediate line Lo. Accordingly, the magnetic flux generated by the current flowing between the line Lp and the intermediate line Lo (low-frequency current: indicated by "Ia" in FIG. 4) and the current flowing between the intermediate line Lo and the line Ln (low-frequency current: indicated by "Ib" in FIG. 4) are orthogonal to the magnetic flux generated by the high-frequency current (indicated by "Ic" in FIG. 4). Therefore, the magnetic flux generated by the high-frequency current is superimposed on the magnetic flux generated by the low-frequency current, which prevents the radiation noise due to the magnetic flux generated by the high-frequency current from increasing.

Hereinafter, the direction of the magnetic flux is defined as the direction of the part of the magnetic flux generated by current, the part having the highest flux density. That is, the direction of the magnetic flux generated by the low-frequency current is orthogonal to the paper surface of FIG. 4, the direction being indicated by "DA" and "DB". In contrast, the direction of the magnetic flux generated by the high-frequency current is the direction being indicated by "DC" in FIG. 4. Note that, although FIG. 4 shows the "DA", "DB" as the direction which is from the front side to the back side, the direction may be from the back side to the front side.

In addition, the high-potential-side line Lp, the intermediate line Lo, and the low-potential-side line Ln and lines connected to the gate and the Kelvin emitter electrode (G, E in FIG. 4) extend to the sides of the surfaces of the multilayer board 20 opposed to each other. Hence, the magnetic flux generated by the current flowing between the high-potential-side line Lp and the intermediate line Lo and the current flowing between the intermediate line Lo and the low-potential-side line Ln can appropriately be prevented from influencing the gate and the Kelvin emitter electrode.

According to the embodiment described above, the following advantages can be obtained.

(1) The high-potential-side switching element Swp and the free wheel diode FDp, and the low-potential-side switching element Swn and the free wheel diode FDn are arranged in the multilayer board 20. The snubber circuit SC forming the loop circuit together with the switching elements Swp, Swn is arranged on the multilayer board 20. Hence, the current path can be sufficiently small in which sudden variation in current is generated due to ON/OFF operation of the switching elements Swp, Swn, which can prevent the surge and the radiation noise.

(2) The magnetic flux generated by the current flowing between the line Lp and the intermediate line Lo and the current flowing between the intermediate line Lo and the line Ln is orthogonal to the magnetic flux generated by the high-frequency current. Hence, superimposing the magnetic flux due to the high-frequency current generated by the change of the switching state of the switching elements Swp, Swn on the magnetic flux generated by the current flowing between the line Lp and the intermediate line Lo and the current flowing between the intermediate line Lo and the line Ln can appropriately avoid the situation in which radiation noise and the like increases.

(3) The high-potential-side line Lp connected to the high-potential-side bus bar Bp, the intermediate line Lo connected to the bus bar Bo, and the low-potential-side line Ln connected to the low-potential-side bus bar Bn, and lines connected to the gate and the Kelvin emitter electrode (G, KE in FIG. 4) extend to the sides of the surfaces of the multilayer board 20 opposed to each other. Hence, the magnetic field generated by the current flowing between the lines Lp, Ln and the intermediate line Lo can appropriately be prevented from affecting the gate and the Kelvin emitter electrode.

(4) The surface areas of the wiring layers 26p, 26n, the conductors 30p, 30n, the wiring layer 36, and the conductor 40 are larger than the surface areas of the semiconductor chips 22p, 22n. Hence, the heat from the semiconductor chips 22p, 22n can appropriately be radiated through the wiring layers 26p, 26n, 36 and the conductors 30p, 30n, 40.

(5) The heights of the conductors 30p, 30n are equal to or more than the height of the element forming the snubber circuit SC. Hence, the heights of the conductors 30p, 30n are sufficiently ensured, which can enhance the effect of diffusing the heat of the semiconductor chips 22p, 22n.

(6) The heat of the conductors 30p, 30n and the heat of the conductor 40 are radiated to the heat sinks 44, 48 through the insulating films 42, 46. Hence, the effect of heat radiation of the semiconductor chips 22p, 22n can be further enhanced.

(7) The snubber circuit SC is connected to the wiring layers 26p, 26n via the via conductors 32p, 32n. Hence, the capacitor 16 can be connected to the resistor 18 by the wiring layers 26p, 26n.

(Second Embodiment)

Hereinafter, the second embodiment will be described with reference to the accompanying drawings, focusing on the differences from the first embodiment.

Figure 5:
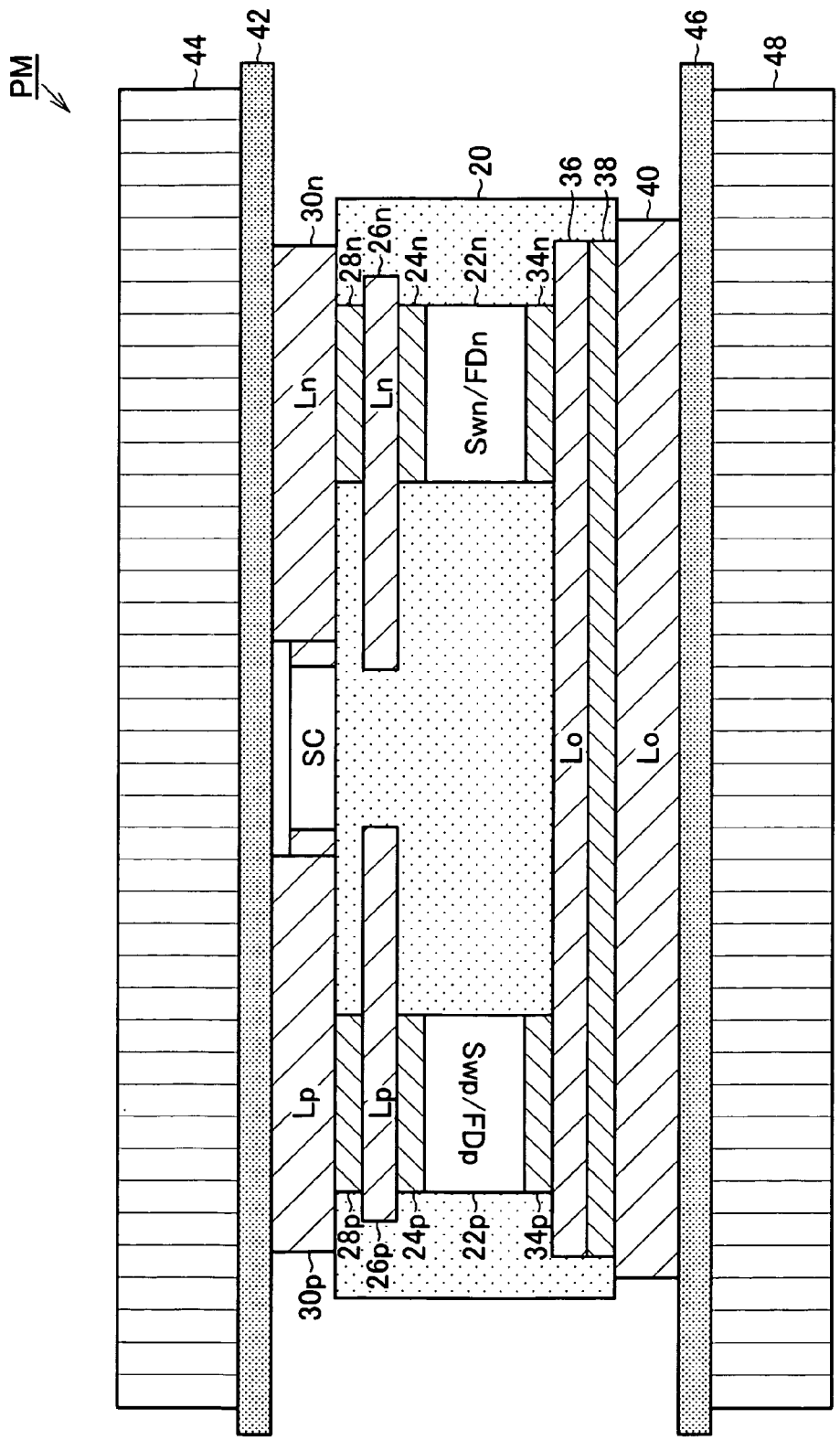
FIG. 5 is a diagram showing a system configuration according to a second embodiment.

FIG. 5 is a sectional view showing a configuration of a power module PM according to the present embodiment. In FIG. 5, the members corresponding to those shown in FIG. 2 are denoted with the same reference numerals for the sake of convenience.

As shown in FIG. 5, in the present embodiment, the via conductors 32p, 32n shown in FIG. 2 are deleted, and the conductors 30p, 30n are directly connected to the snubber circuit SC. In this case, the capacitor 16 and the resistor 18 are connected to each other on the surface of the multilayer board 20.

(Third Embodiment)

Hereinafter, the third embodiment will be described with reference to the accompanying drawings, focusing on the differences from the first embodiment.

Figure 6:
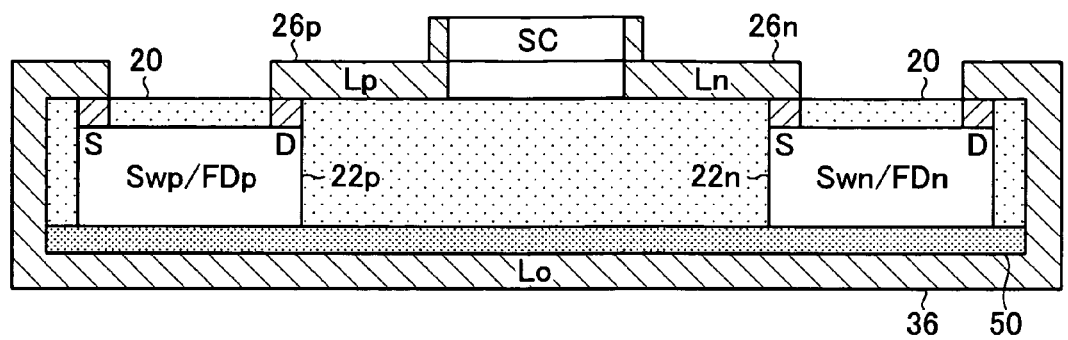
FIG. 6 is a diagram showing a system configuration according to a third embodiment.

FIG. 6 is a sectional view showing a configuration of a multilayer board according to the present embodiment. In FIG. 6, the members corresponding to those shown in FIG. 2 are denoted with the same reference numerals for the sake of convenience.

In the present embodiment, the switching elements Swp, Swn are N-channel power MOSFETs (metal-oxide semiconductor field-effect transistor). The free wheel diodes FDp, FDn are parasitic diodes of the transistors. The transistors are horizontal devices. That is, both the source and the drain are formed on each one surface of the semiconductor chips 22p, 22n. The transistors may be formed of, for example, GaN-HEMTs (Gallium Nitride High Electron Mobility Transistor).

Specifically, as shown in FIG. 6, the semiconductor chips 22p, 22n are formed in the same layer of the multilayer board 20. The drain D of the high-potential-side switching element Swp and the snubber circuit SC are connected to each other via the wiring layer 26p formed on the surface of the multilayer board 20. The source S of the low-potential-side switching element Swn and the snubber circuit SC are connected to each other via the wiring layer 26n formed on the surface of the multilayer board 20. The source S of the high-potential-side switching element Swp and the drain D of the low-potential-side switching element Swn are connected to each other via the wiring layer 36 formed on the back side of the multilayer board 20. Note that an insulating film 50 is formed between the multilayer board 20 and the wiring layer 36 and on the side of the back side of the multilayer board 20. The insulating film 50 preferably has as high heat conductivity as possible. For example, the insulating film 50 may be made of ceramic, an insulating film or the like.

In the above configuration, the snubber circuit SC does not contact the insulator (multilayer board 20) in which the semiconductor chips 22p, 22n are embedded. However, even in this case, the snubber circuit SC is formed so as to run in parallel with the electric path connecting between the wiring layers 26p and 26n at the shortest distance, and the snubber circuit SC is formed in the power module PM substantially integrally with the semiconductor chips 22p, 22n and the like. Hence the advantage (1) of the first embodiment can be obtained.

(Fourth Embodiment)

Hereinafter, the fourth embodiment will be described with reference to the accompanying drawings, focusing on the differences from the first embodiment.

Figure 7:
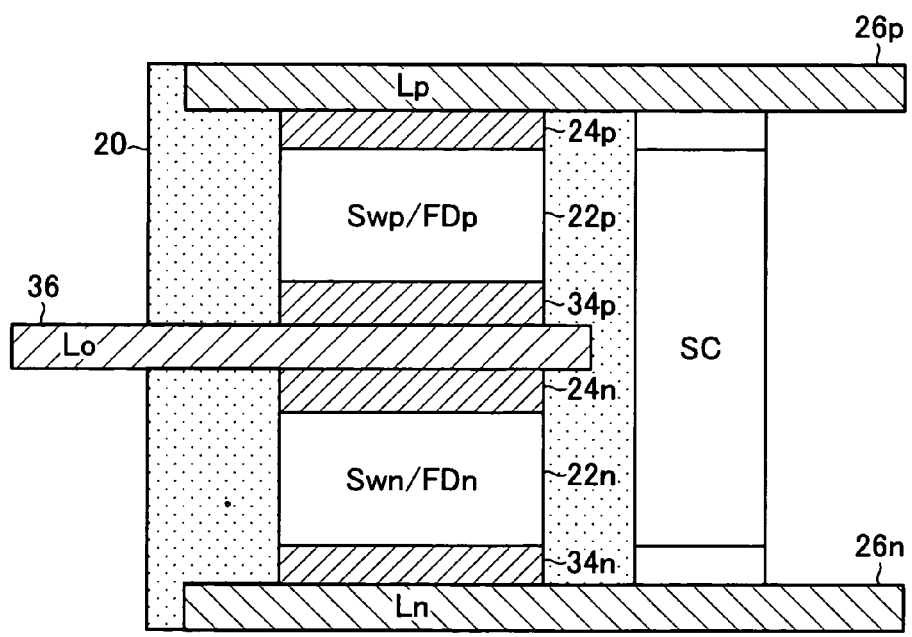
FIG. 7 is a diagram showing a system configuration according to a fourth embodiment.

FIG. 7 is a sectional view showing a configuration of a multilayer board according to the present embodiment. In FIG. 7, the members corresponding to those shown in FIG. 2 are denoted with the same reference numerals for the sake of convenience.

In the present embodiment, the semiconductor chips 22p, 22n are arrange in series in the direction orthogonal to a pair of surfaces of the semiconductor chips 22p, 22n on which the emitters and the collectors are formed. Specifically, the arrangement can be realized by embedding the semiconductor chips 22p, 22n in the respective layers of the multilayer board 20.

Specifically, the wiring layer 26n connecting between the snubber circuit SC and the low-potential-side switching element Swn is formed on one surface of the multilayer board 20. The wiring layer 26n is connected to the surface of the semiconductor chip 22n on which the emitter and the anode are formed via the via conductor 34n. The surface of the semiconductor chip 22p to which the collector and the cathode are connected is connected to the wiring layer 36 via the conductor 24n. The wiring layer 36 is formed so as to protrude from the multilayer board 20. The wiring layer 36 is connected to the surface of the semiconductor chip 22p on which the emitter and the anode are formed via a via conductor 34p. The surface of the semiconductor chip 22p on which the collector is formed is connected to the wiring layer 26p via the via conductor 24p.

The wiring layers 26p, 26n extend so as to protrude from the multilayer board 20 and are connected to the snubber circuit SC which is juxtaposed to the multilayer board 20.

Even in the above configuration, high-frequency current due to the change of the switching state of the switching elements Swp, Swn can be enclosed in the small loop path.

(Fifth Embodiment)

Hereinafter, the fifth embodiment will be described with reference to the accompanying drawings, focusing on the differences from the third embodiment.

Figure 8:
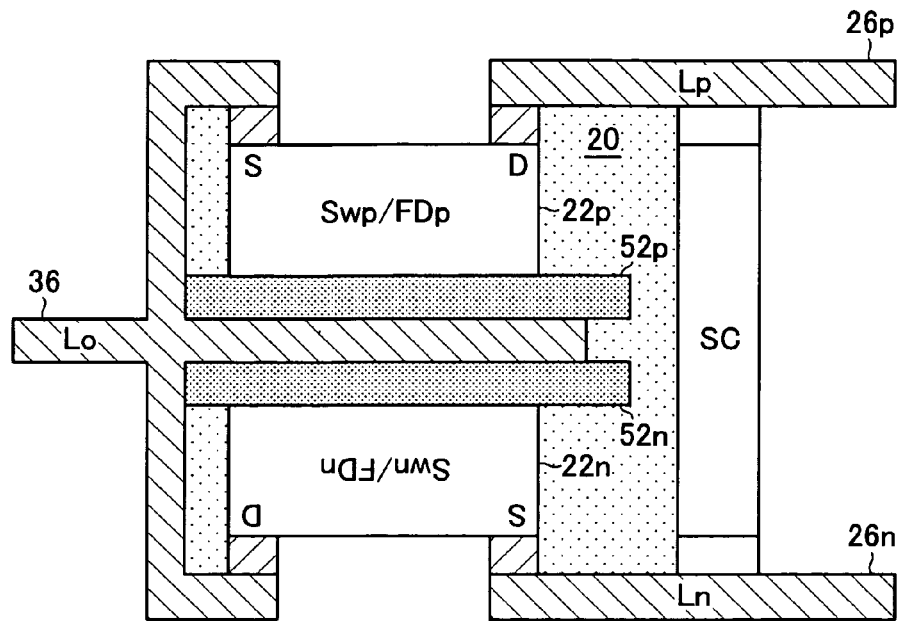
FIG. 8 is a diagram showing a system configuration according to a fifth embodiment.

FIG. 8 is a sectional view showing a configuration of a multilayer board according to the present embodiment. In FIG. 8, the members corresponding to those shown in FIG. 6 are denoted with the same reference numerals for the sake of convenience.

In the present embodiment, the semiconductor chips 22p, 22n, which are horizontal devices, are arrange in series. Specifically, the arrangement can be realized by embedding the semiconductor chips 22p, 22n in the respective layers of the multilayer board 20.

Specifically, the surface of the semiconductor chip 22p on which the source S and the drain D are formed and the surface of the semiconductor chip 22n on which the source S and the drain D are formed are arranged on the sides of the surfaces of the multilayer board 20 which are opposed to each other. The wiring layer 36 is formed between the surfaces of the semiconductor chips 22p, 22n opposed to the surfaces of the semiconductor chips 22p, 22n on which the source S and the drain D are formed, via the insulating films 52p, 52n. The wiring layer 36 extends along the side surface of the multilayer board 20, and is connected to the source S of the semiconductor chip 22p and the drain D of the semiconductor chip 22n. Note that the wiring layer 36 extends to the area interposed between the insulating films 52p, 52n to enhance the effect of heat radiation of the semiconductor chips 22p, 22n.

In addition, the drain D of the semiconductor chip 22p and the source S of the semiconductor chip 22n are connected to the snubber circuit SC, which is juxtaposed to the multilayer board 20, via the wiring layers 26p, 26n, respectively.

Even in the above configuration, high-frequency current due to the change of the switching state of the switching elements Swp, Swn can be enclosed in the small loop path.

(Sixth Embodiment)

Hereinafter, the sixth embodiment will be described with reference to the accompanying drawings, focusing on the differences from the first embodiment.

Figure 9:
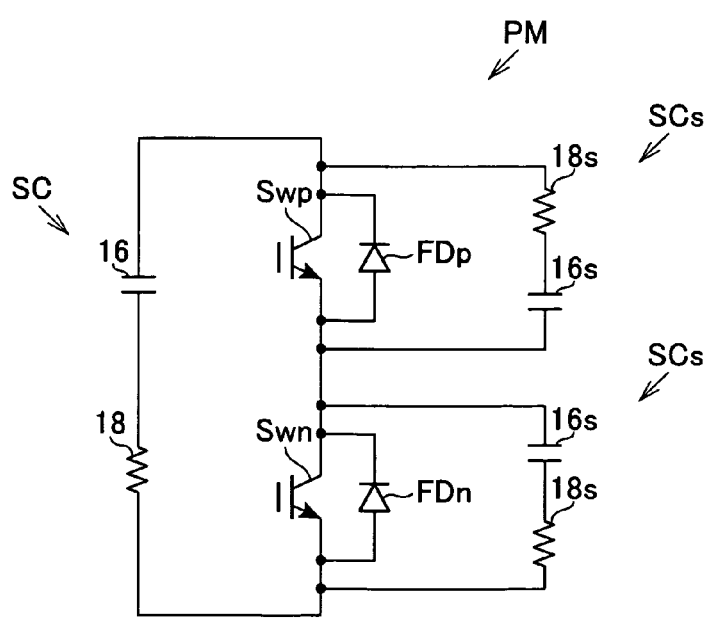
FIG. 9 is a circuit diagram showing a circuit configuration of a power module according to a sixth embodiment.

FIG. 9 shows a circuit configuration of a power module PM according to the present embodiment. In FIG. 9, the members corresponding to those shown in FIG. 1 are denoted with the same reference numerals for the sake of convenience.

As shown in FIG. 9, in the present embodiment, individual snubber circuits SCs are connected between the respective input terminals and output terminals of the high-potential-side switching element Swp and the low-potential-side switching element Swn. The individual snubber circuit SCs is a series-connected unit of a resistor 18s and a capacitor 16s, which is connected to individual switching elements. The individual snubber circuit SCs can appropriately restrict the surge. That is, first, the surge can be restricted by limiting the rate of variation in voltage between the input terminal and the output terminal by the individual snubber circuits SCs when the switching elements Swp, Swn are switched from an ON state to an OFF state. Second, the surge can be restricted by limiting the rate of variation in voltage by the individual snubber circuits SCs when voltage is applied across the free wheel diodes FDp, FDn due to the sudden variation in current due to the recovery phenomenon of the free wheel diodes FDp, FDn.

Figure 10:
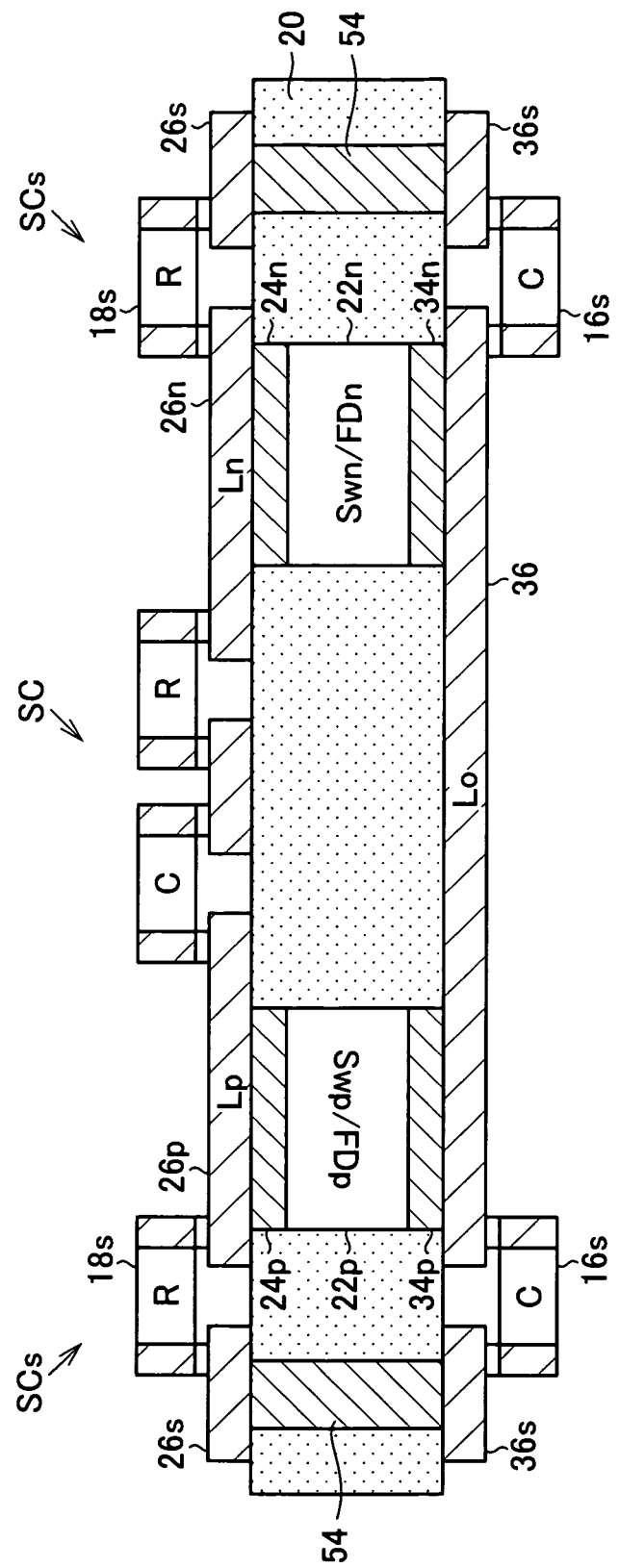
FIG. 10 is a sectional view showing a configuration of the power module according to the sixth embodiment.

FIG. 10 shows a sectional configuration of a power module PM according to the present embodiment. In FIG. 10, the members corresponding to those shown in FIG. 2 are denoted with the same reference numerals for the sake of convenience.

As shown in FIG. 10, first terminals of the resistors 18s configuring the individual snubber circuits SCs are connected to the respective wiring layers 26p, 26n. In addition, wiring layers 26s are formed in the same layer as that of the wiring layers 26p, 26n. Second terminals of the resistors 18s of the individual snubber circuits SCs are connected to the wiring layers 26s. Meanwhile, first terminals of the capacitors 16s configuring the individual snubber circuits SCs are connected to the wiring layer 36. In addition, wiring layers 36s are formed in the same layer as that of the wiring layer 36. Second terminals of the capacitors 16s of the individual snubber circuits SCs are connected to the wiring layers 36s. The wiring layers 26s and the wiring layers 36s, which correspond to the respective individual snubber circuits SCs, are connected to each other by conductors 54 penetrating through the multilayer board 20.

According to the above configuration, the current flowing between the semiconductor chip 22p and the wiring layer 26s and the current flowing between the semiconductor chip 22p and the wiring layer 36s can be opposed to each other and can flow in the respective directions opposite to each other. Hence, parasitic inductance of the wiring layers 26p, 26s, 36s, 36 and the like can be reduced. In addition, the current path connecting between the individual snubber circuit SCs and the both terminals of the high-potential-side switching element Swp and the free wheel diodes FDp can be formed into a short loop, which can reduce the parasitic inductance of the individual snubber circuit SCs and reduce the radiation noise. Note that the above effects can also be obtained from the individual snubber circuit SCs connected to the semiconductor chip 22n.

Note that, in the present embodiment, the wiring layers 26p, 26n, 36 serve as the radiating function for the semiconductor chips 22p, 22n.

Figure 11A:
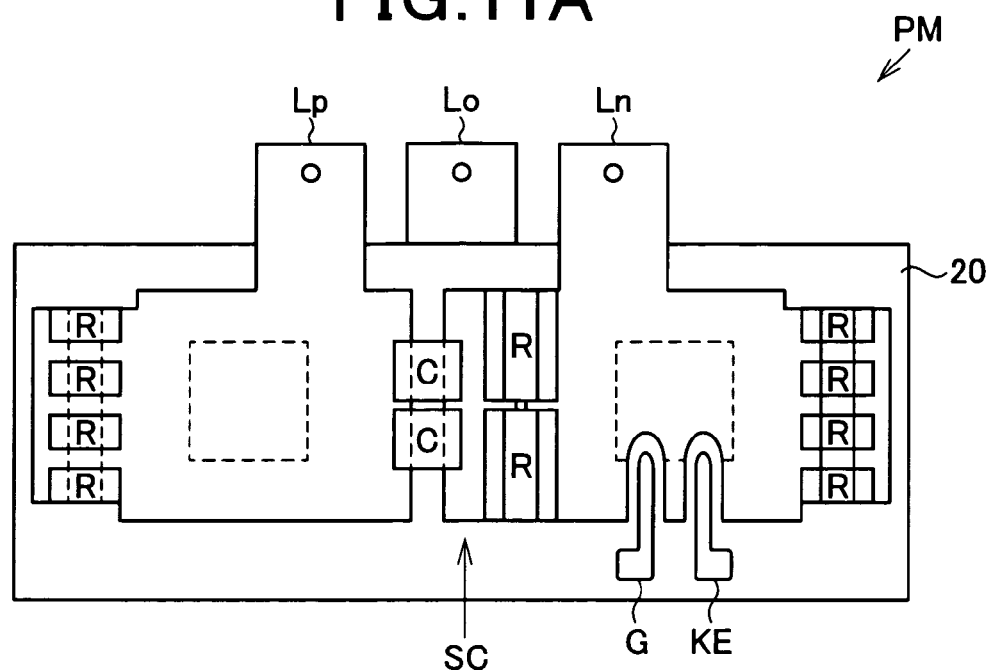
FIGS. 11A and 11B are plan views of the power module according to the sixth embodiment.
Figure 11B:
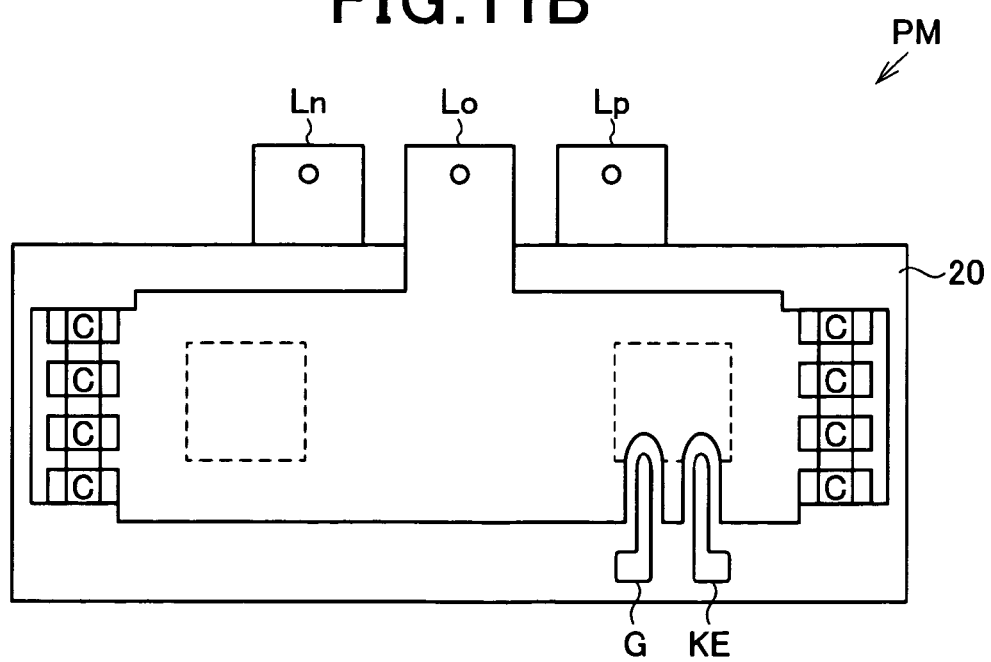

FIG. 11A shows a top configuration of the power module PM. FIG. 11B shows a bottom configuration of the power module PM. In FIGS. 11A and 11B, each of the snubber circuit SC and the individual snubber circuit SCs includes a parallel-connected unit of capacitors. This configuration aims to form the loop circuit including the switching elements Swp, Swn and the individual snubber circuits SCs into a short loop furthermore. That is, when using the capacitor 16s having a larger surface area to ensure the capacitance thereof, the stress due to temperature change becomes great. If the gap between the capacitor 16s and the multilayer board 20 is enlarged to reduce the influence of the temperature change, the effect of forming the current path into a short loop is reduced. Hence, a parallel-connected unit of a plurality of capacitors is used as the capacitor 16s.

According to the embodiment described above, the following advantages can be obtained in addition to those of the first embodiment.

(8) Providing the individual snubber circuits SCs can reduce the surge.

(9) The lines (the wiring layers 26p, 26n, 26s, 36s, 36 and the conductor 54) connecting between the individual snubber circuits SCs and the semiconductor chips 22p, 22n are configured as the lines of the multilayer board 20. Hence, the loop path including the individual snubber circuits SCs and the semiconductor chips 22p, 22n can be formed into a short loop.

(10) The resistor 18s and the capacitor 16s of the individual snubber circuit SCs are mounted on the respective surfaces (a pair of surfaces) of the multilayer board 20. Hence, the loop path including the individual snubber circuits SCs and the semiconductor chips 22p, 22n can be formed into a short loop furthermore.

(11) The capacitor of the snubber circuit SC and that of the individual snubber circuit SCs are configured with a parallel-connected unit of a plurality of capacitors. Hence, the current path can appropriately be formed into a short loop while ensuring the capacitance.

(Seventh Embodiment)

Hereinafter, the seventh embodiment will be described with reference to the accompanying drawings, focusing on the differences from the sixth embodiment.

Figure 12:
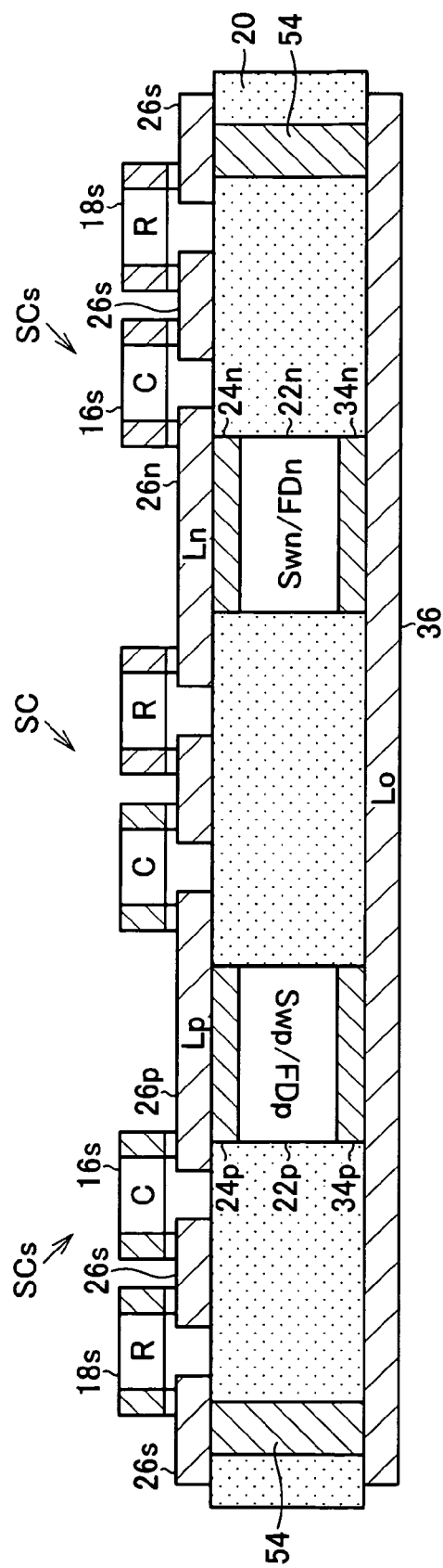
FIG. 12 is a sectional view showing a configuration of a power module according to a seventh embodiment.

FIG. 12 shows a sectional configuration of a power module PM according to the present embodiment. In FIG. 12, the members corresponding to those shown in FIG. 10 are denoted with the same reference numerals for the sake of convenience.

As shown in FIG. 12, in the present embodiment, both the capacitor 16s and the resistor 18s are arranged on the side of one surface of the multilayer board 20. In this case, the loop circuit configured with the both ends of the switching elements Swp, Swn and the free wheel diodes FDp, FDn and the individual snubber circuits SCs becomes large compared with the loop circuit of the sixth embodiment. However, surface mounting can be performed only with respect to one surface of the multilayer board 20, which can simplify the manufacturing process.

Even in the above configuration, the advantages (8), (9), (11) of the sixth embodiment can be obtained.

(Eighth Embodiment)

Hereinafter, the eighth embodiment will be described with reference to the accompanying drawings, focusing on the differences from the first embodiment.

Figure 13:
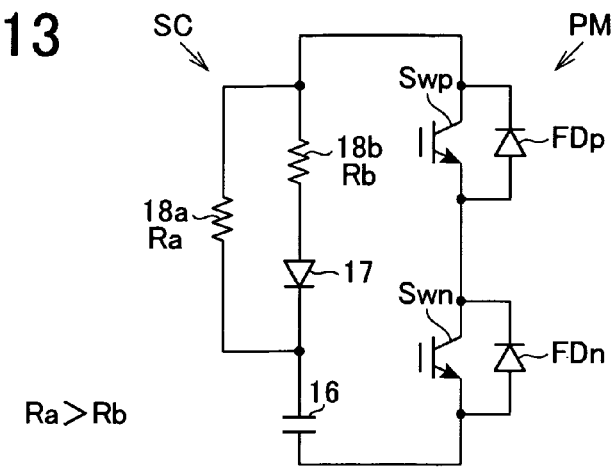
FIG. 13 is a circuit diagram showing a configuration of a snubber circuit according to an eighth embodiment.

FIG. 13 shows a configuration of a power module PM according to the present embodiment. In FIG. 13, the members corresponding to those shown in FIG. 1 are denoted with the same reference numerals for the sake of convenience.

As shown in FIG. 13, the snubber circuit SC according to the present embodiment includes a resistor 18b connected to a series-connected unit of the high-potential-side switching element Swp and the low-potential-side switching element Swn in parallel, a series-connected unit of a diode 17 and the capacitor 16, and a resistor 18a connected to the resistor 18b and the capacitor 16 in parallel. The resistor 18b and the diode 17 configure a charging path of the capacitor 16. The resistor 18a configures a discharging path of the capacitor 16. The resistance value Ra of the resistor 18a is larger than the resistance value Rb of the resistor 18b. Hereinafter, the operation of the snubber circuit SC will be explained.

Figure 14A:
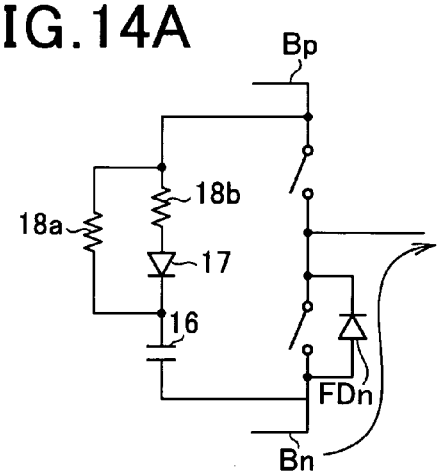
FIGS. 14A, 14B, and 14C are circuit diagrams showing operations of the snubber circuit according to the eighth embodiment.
Figure 14B:
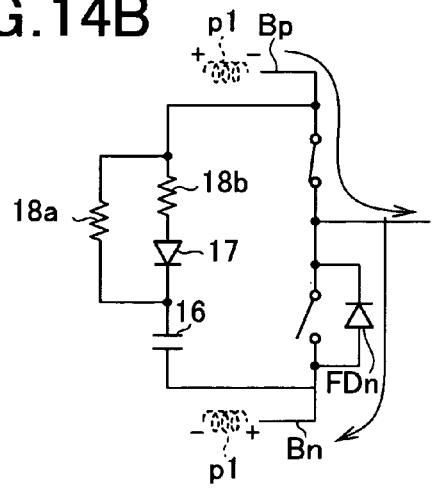

As shown in FIG. 14A, in a state where a current flows to the free wheel diode FDn of a lower arm, it is assumed that the switching elements Swp of an upper arm is turned on as shown in FIG. 14B. In this case, although a current starts to flow from the high-potential-side bus bar Bp to the high-potential-side switching element Swp, the rate of increase of current is limited by the counter-electromotive force generated by parasitic inductance pl of the high-potential-side bus bar Bp. In addition, although current flowing through the low-potential-side bus bar Bn decreases, the rate of decrease of current is limited by the counter-electromotive force generated by the parasitic inductance pl of the low-potential-side bus bar Bn. In this case, the counter-electromotive force of the parasitic inductance pl of the high-potential-side bus bar Bp and the counter-electromotive force of the parasitic inductance pl of the low-potential-side bus bar Bn have the polarity on the side on which input voltage of the inverter IV applied between the input terminal and the output terminal of the high-potential-side switching element Swp is canceled. Hence, the voltage applied between the input terminal and the output terminal when turning on the high-potential-side switching element Swp can make small, which can reduce switching loss when switching to an ON state.

The effect of the reduction of the switching loss relates to the fact that the resistance value Ra of the resistor 18a is made large. That is, when the resistance value Ra is made small, the current flowing through the high-potential-side switching element Swp when the high-potential-side switching element Swp is turned on and recovery current flowing through the free wheel diode FDn are complemented by the current discharged from the capacitor 16 via the resistor 18a. Hence, the counter-electromotive force generated by the parasitic inductance pl becomes small.

Figure 14C:
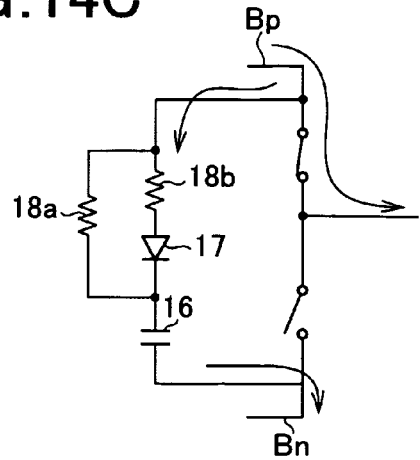

Thereafter, as shown FIG. 14C, during the time period during which the recovery current of the free wheel diode FDn decreases, the capacitor 16 is charged via a charging path including the resistor 18b and the diode 17, whereby variation in current flowing through the high-potential-side bus bar Bp and the low-potential-side bus bar Bn can be reduced, which can appropriately reduce the surge voltage.

The surge voltage can be reduced during the time period during which the recovery current decreases, the first reason for which is described in the first embodiment. That is, the reason is that, by forming the path (the path through which high-frequency current flows) including the resistor 18a, the diode 17 and the capacitor 16, and the high-potential-side switching element Swp and the low-potential-side switching element Swn into a short loop, the parasitic inductance of the path can be made sufficiently small. The second reason is that the resistance value Rb of the resistor 18 is made small. That is, since charging current of the capacitor 16 can rapidly be increased, variation in current of the high-potential-side bus bar Bp and the low-potential-side bus bar Bn can sufficiently be reduced.

Note that the surge voltage is reduced by the snubber circuit SC during the time period during which the recovery current of the free wheel diodes FDp reduces or when the switching elements Swp, Swn are changed from an ON state to an OFF state.

As described above, the snubber circuit SC according to the present embodiment is especially effective in the configuration in which the path through which high-frequency current flows is formed into a short loop. Note that the resistance value Ra of the resistor 18a determines the discharging rate of the capacitor 16. The discharging rate of the capacitor 16 may be small under the condition that a situation is avoided in which the voltage of the capacitor 16 gradually increases or can fall within the acceptable range.

(Ninth Embodiment)

Hereinafter, the ninth embodiment will be described with reference to the accompanying drawings, focusing on the differences from the eighth embodiment.

Figure 15A:
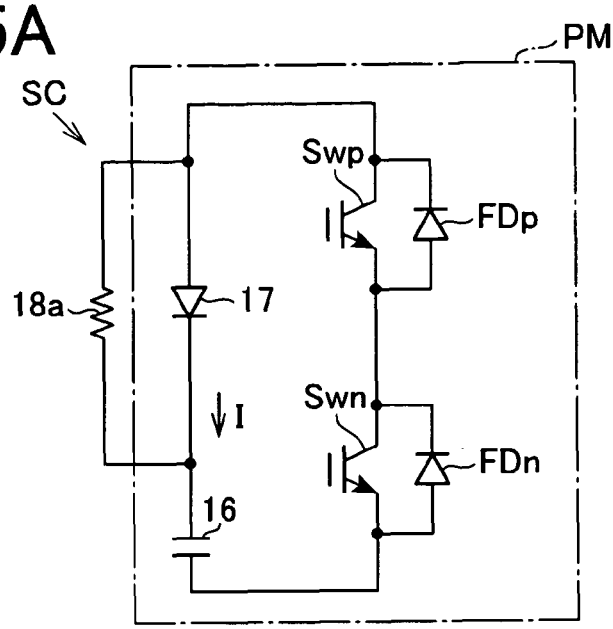
FIG. 15A is a circuit diagrams showing a configuration of a snubber circuit according to a ninth embodiment.

FIG. 15A shows a configuration of a power module PM according to the present embodiment. In FIG. 15A, the members corresponding to those shown in FIG. 13 are denoted with the same reference numerals for the sake of convenience.

As shown in FIG. 15A, in the present embodiment, the resistor 18b is not provided in the charging path of the capacitor 16. Note that on-resistance of the diode 17 is set so as to be larger than that of the eighth embodiment. The setting is for restricting the generation of the resonance phenomenon between the capacitor 16 and the parasitic inductance of the high-potential-side bus bar Bp and the low-potential-side bus bar Bn. That is, when the on-resistance of the diode 17 is made small, the resonance phenomenon is generated. Hence, as shown by a broken line of FIG. 15B, the charging current I2 of the capacitor 16 becomes a sine wave shape. Conversely, when the on-resistance of the diode 17 is made large, the generation of the resonance phenomenon is restricted, whereby charging current I1 can flow as shown by a solid line of FIG. 15A. The charging current I1 is determined by the switching rate of the switching state of the switching elements Swp, Swn.

If the parasitic inductance does not exist when the switching state is changed, the above setting is especially effective if the rate of variation in current flowing through the switching elements is larger than the rate of variation in the charging current I2 flowing by the resonance phenomenon. That is, in this case, by restricting the generation of the resonance phenomenon, the charging rate of the capacitor 16 can be determined according to the changing rate of the switching state.

In addition, it is confirmed that when the impedance of the charging path is excessively low, the resonance phenomenon is generated even at the time of discharging from the capacitor 16 via the resistor 18a. From the above viewpoint, restricting the generation of the resonance phenomenon is effective when the on-resistance of the diode 17 is made high.

Furthermore, in the present embodiment, the resistor 18a is attached to the outside of the power module PM. This considers that the calorific power of the resistor (resistor 18a), which is a linear device of the snubber circuit SC, easily becomes large. Since the resistor 18a configures a discharging path of the capacitor 16, the path configured by the series-connected unit of the switching elements Swp, Swn and the resistor 18a is not required to be formed into a short loop. In the present embodiment, the charging path which is required to be formed into a short loop does not include a resistor, whereby the problem of heat generation can appropriately be prevented.

(Tenth Embodiment)

Hereinafter, the tenth embodiment will be described with reference to the accompanying drawings, focusing on the differences from the eighth embodiment.

Figure 16:
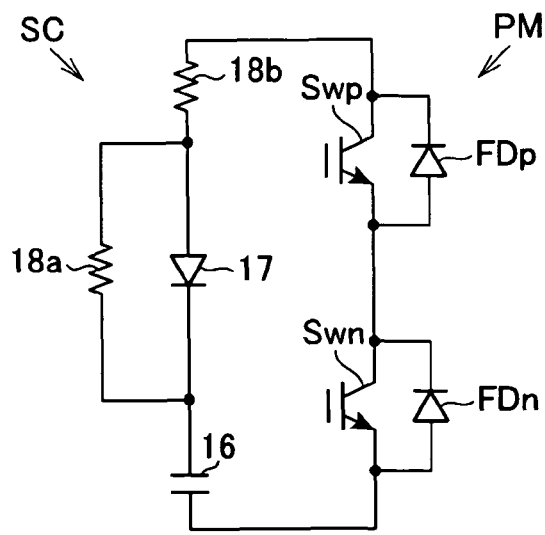
FIG. 16 is a circuit diagram showing a configuration of a snubber circuit according to a tenth embodiment.

FIG. 16 shows a configuration of a power module PM according to the present embodiment. In FIG. 16, the members corresponding to those shown in FIG. 13 are denoted with the same reference numerals for the sake of convenience.

As shown in FIG. 16, in the present embodiment, the resistor 18b is shared by a charging path and a discharging path. Hence, the charging path includes the resistor 18b, and the discharging path includes the series-connected unit of the resistor 18a and the resistor 18b.

In this case, for example, by manufacturing the resistor 18a and the resistor 18b as one resistor, the process regarding the implementation of the resistor can be simplified, and the implementation area can be reduced. In this case, cost reduction and short loop formation for the high-frequency current path can easily be improved.

(Other Embodiments)

The above embodiments may be modified as follows.

Regarding an angle between the magnetic flux generated by the low-frequency current and the magnetic flux generated by the high-frequency current:

The angle between the magnetic flux generated by the low-frequency current and the magnetic flux generated by the high-frequency current is not limited to the right angle exemplified in the first and second embodiments. Compared with the case where the magnetic flux generated by the low-frequency current and the magnetic flux generated by the high-frequency current are parallel to each other, in the case where the magnetic fluxes are not parallel to each other, the influence of the magnetic flux generated by the high-frequency current on the magnetic flux generated by the low-frequency current becomes small, whereby the effect of reduction of noise radiation is promising.

Regarding arrangement of the conductor and the bus bar connected to the switching control terminal:

The arrangement is not limited to that exemplified in the first embodiment in which the conductors extend to the sides of the surfaces of the multilayer board 20 opposed to each other (that is, the arrangement is not limited to that in which the conductors extend so as to be at an 180 degrees). That is, the conductors may extend to the sides of the surfaces so as to be at a right angle. Even in this arrangement, compared with the case in which the conductors extend to the side of the same surface of the multilayer board 20, it becomes difficult for the switching control terminal to be influenced by the magnetic field generated by the current flowing between the lines Lp, Ln and the intermediate line Lo.

Regarding the lines connected to the switching control terminal and the reference potential terminal:

The lines are not restricted to forming one layer. Note that when the lines form layers different from each other, the magnetic flux generated by the high-frequency current indicated in FIG. 4 can cross between the pair of the lines, which can generate electromotive force by which current flows from one of the pair of the lines to the other of the pair of the lines. Hence, when performing the above setting, it is desirable that the lines are arranged in areas in which the density of the magnetic flux is relatively small by extending the lines outward from the surface orthogonal to the surface orthogonal to the lines Lp, Ln, Lo and connected to the lines Lp, Ln, Lo shown in FIG. 4. Specifically, in this case, if the pair of lines is arranged on the same coordinates on the flat surface shown in FIG. 4, the lines are less influenced by the magnetic field generated by the low-frequency current.

Regarding the line connecting between the switching element and the snubber circuit:

The line is not limited to be configured by including the wiring layer 26*p* and the conductor 30*p*, the wiring layer 26*n* and the conductor 30*n*, and the wiring layer 36 and the conductor 40. For example, the wiring layers and the conductors may be integrally configured. This configuration can be achieved, for example, by opening the surface of the multilayer board 20 so that the openings have the same areas as the surface areas of the wiring layers 26*p*, 26*n*, and arranging the conductors 30*p*, 30*n* in the openings.

In addition, when the multilayer board 20 has sufficient heat conductivity, the areas of the wiring layers 26*p*, 26*n* do not have to be larger than those of the semiconductor chips 22*p*, 22*n*.

Figure 17:
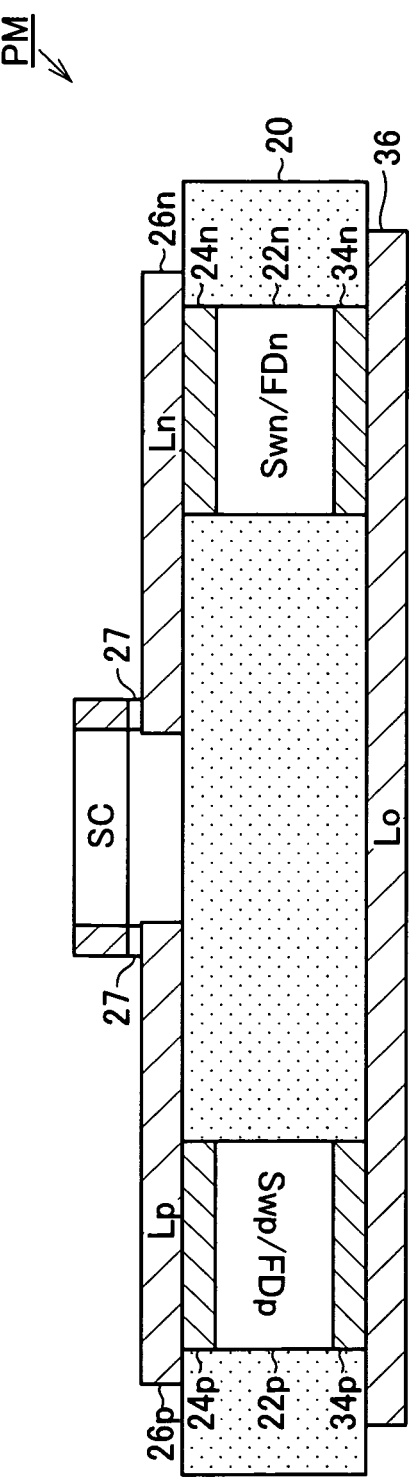
FIG. 17 is a sectional view showing a configuration of a power module according to a modification of the first embodiment.

Furthermore, if heat radiation via the heat sink 44 is not required, the heights of the conductors 30*p*, 30*n* may be lower than the height of the snubber circuit SC. Note that, as in the sixth and seventh embodiments, when the wiring layers 26*p*, 26*n*, 36 have sufficient heat radiation functions, the conductors 30*p*, 30*n*, 40 are optional. FIG. 17 exemplifies the above configuration adapted to the first embodiment. In FIG. 17, the members corresponding to those shown in FIG. 2 are denoted with the same reference numerals for the sake of convenience. Note that the conductors connecting between the wiring layers 26*p*, 26*n* and the snubber circuit SC are solders 27. In the configuration shown in FIG. 17, the snubber circuit SC does not contact the insulator (multilayer board 20) in which the semiconductor chips 22*p*, 22*n* are embedded. However, even in this case, since the snubber circuit SC is formed substantially integrated with the semiconductor chips 22*p*, 22*n* and the like in the power module PM, the advantage (1) and the like of the first embodiment can be obtained.

Figure 18:
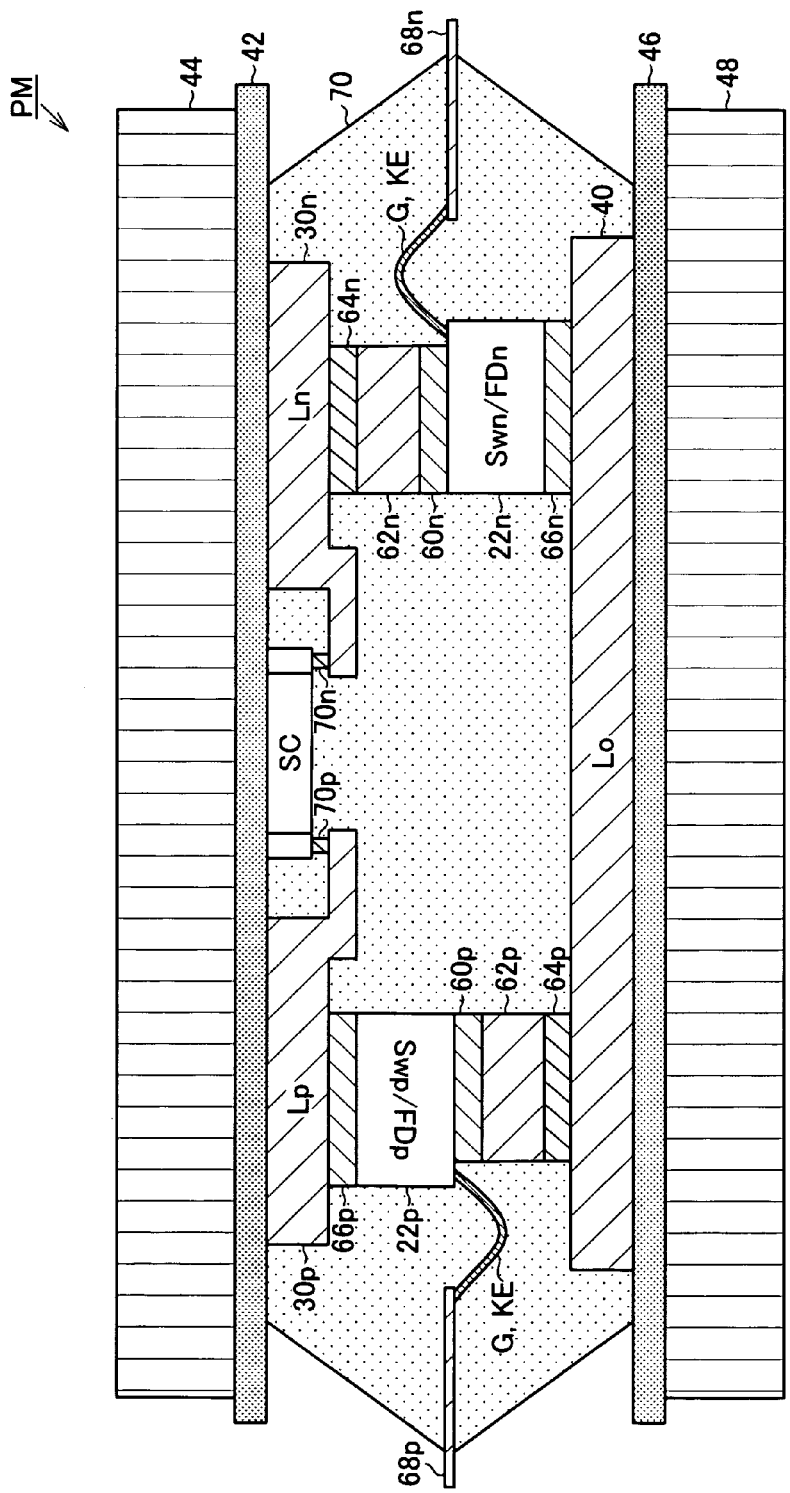
FIG. 18 is a sectional view showing a configuration of a power module according to a modification of the first embodiment.

Regarding the insulator:

The insulator is not limited to the multilayer board 20. For example, as exemplified in FIG. 18, the insulator may be a molding material or the like. In FIG. 18, the members corresponding to those shown in FIG. 2 are denoted with the same reference numerals for the sake of convenience.

In FIG. 18, a conductive spacer 62*p* is connected to a surface, to which the emitter and the anode of the semiconductor chip 22*p* are connected, via solder 60*p*. The conductive spacer 62*p* is connected to the conductor 40 via solder 64*p*. In addition, a conductor 30*p* is connected to the surface, on which the collector and the cathode of the semiconductor chip 22*p* are formed, via solder 66*p*. The conductor 30*p* is connected to the snubber circuit SC via solder 70*p*.

Meanwhile, the conductor 40 is connected to the surface, on which the collector and the cathode of the semiconductor chip 22*n* are formed, via solder 66*n*. In addition, a conductive spacer 62*n* is connected to a surface, to which the emitter and the anode of the semiconductor chip 22*n* are formed, via solder 60*n*. A conductive spacer 62*n* is connected to the conductor 30*n* via solder 64*n*. The conductor 30*n* is connected to the snubber circuit SC via solder 70*n*.

The gate and the Kelvin emitter electrode of the semiconductor chip 22*p* are connected to a terminal 68*p* via bonding wires (indicated by "G" and "KE" in FIG. 18). The gate and the Kelvin emitter electrode of the semiconductor chip 22*n* are connected to a terminal 68*n* via bonding wires (indicated by "G" and "KE" in FIG. 18).

The conductive spacers 62*p*, 62*n* are conductors, for example, copper, having thicknesses for ensuring the space in which the bonding wires are arranged. Note that all the semiconductor chips 22*p*, 22*n*, the conductive spacers 62*p*, 62*n* and the like are covered with the molding material 70. The molding material 70 is formed of, for example, epoxy resin, thermoset resin or the like. In the above configuration, compared with the case where the multilayer board 20 is used, although the current path, in which current (high-frequency current) varies with the change of the switching state of the high-potential-side switching element Swp and the low-potential-side switching element Swn, becomes slightly large, the path can be formed into a short loop.

Figure 19:
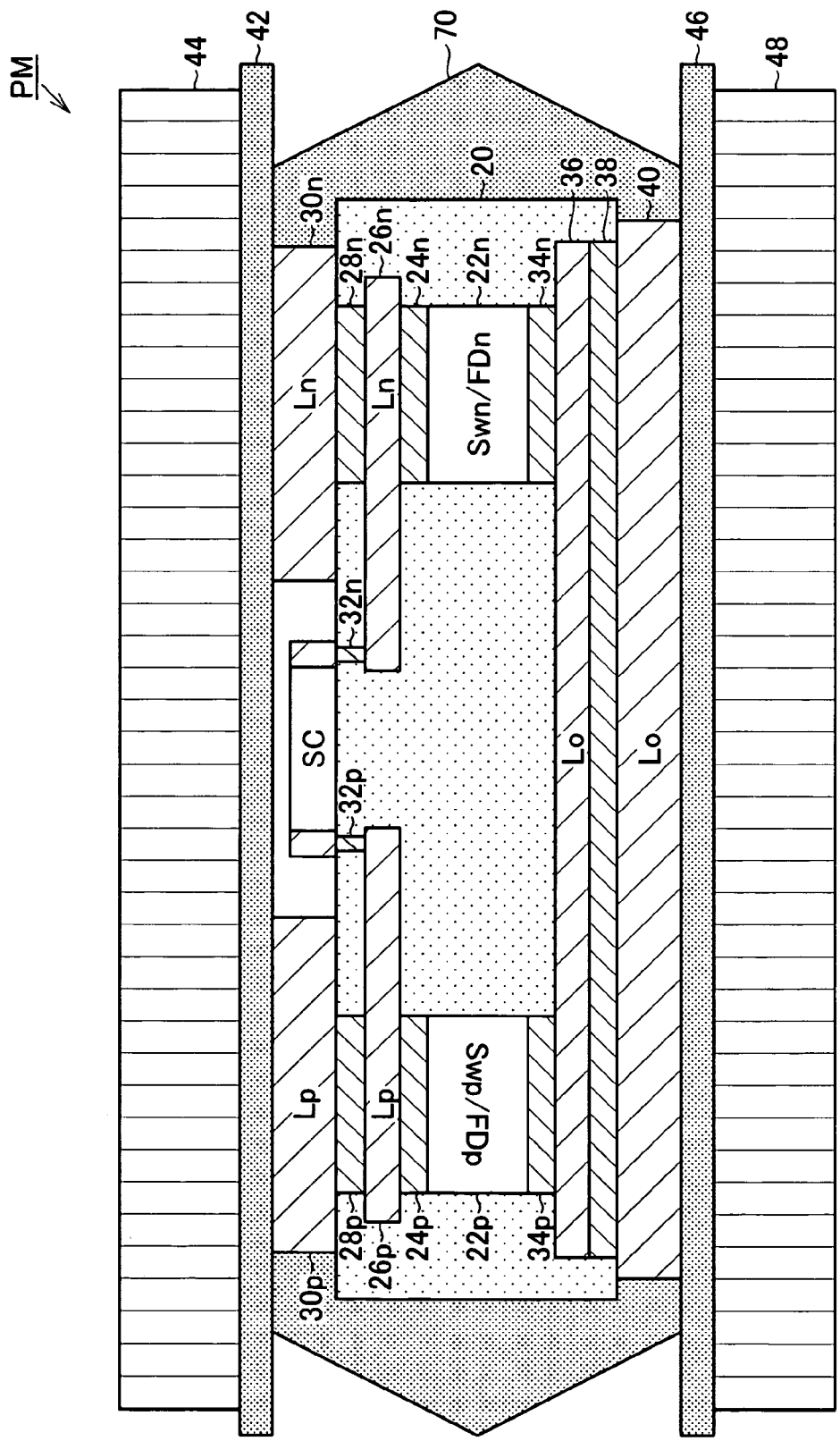
FIG. 19 is a sectional view showing a configuration of a power module according to a modification of the first embodiment.

Note that even in the case where the multilayer board 20 is used, covering the periphery of the multilayer board 20 with the molding material 70, as shown in FIG. 19, is effective. FIG. 19 shows a configuration in which, regarding the configuration shown in FIG. 2, the multilayer board 20 is covered with the molding material 70 except the heat radiation surfaces (surfaces contacting the insulating films 42, 46) of the conductors 30*p*, 30*n*, 40. Note that, in practice, lines connected to the gate and the Kelvin emitter electrode are not completely covered with the molding material 70, and can be electrically connected to an external unit. According to the above configuration, first, the stiffness of the power module PM can be increased. Second, the insulating properties between the conductors 30*p*, 30*n*, 40 can also be increased. That is, when high voltage is applied between the conductors 30*p*, 30*n*, 40, dielectric breakdown can be prevented from occurring compared with a case where the periphery is filled with air.

Regarding the snubber circuit:

In the eighth and tenth embodiments, the resistor 18*a* may be attached to the outside of the power module PM. Note that the resistance value of the resistor 18*b* is equal to or smaller than that of the resistor 18*a* (e.g. a tenth or less), and the size of the resistor 18*b* is also smaller than that of the resistor 18*a*. Hence, when only the resistor 18*b* is provided in the power module PM, the resistor, which is a heating element, can easily be arranged at the position having high heat radiation performance.

Figure 15B:
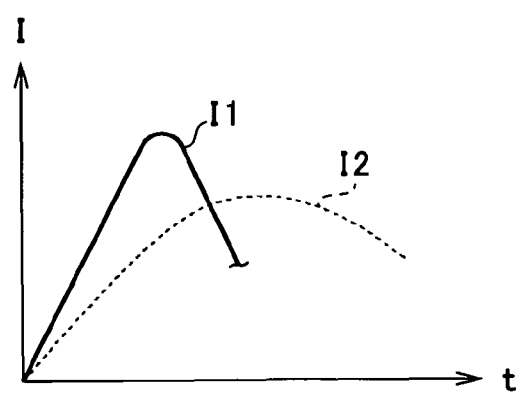
FIG. 15B is a graph.

In the above ninth embodiment, the setting of on-resistance of the diode 17 does not necessarily have the properties shown in FIG. 15B.

Figure 20A:
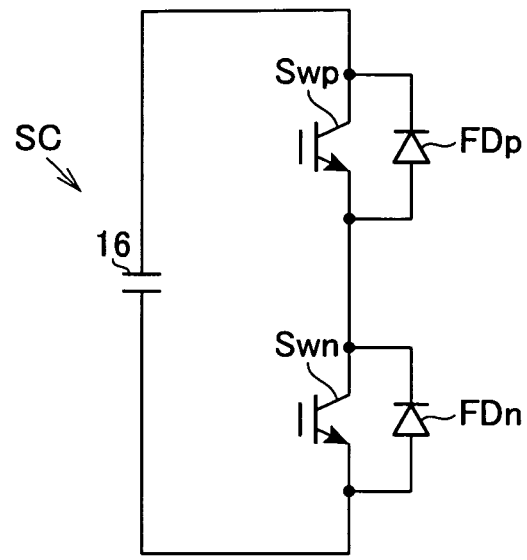
FIGS. 20A and 20B are circuit diagrams showing configurations of snubber circuits according to modifications of the embodiments.
Figure 20B:
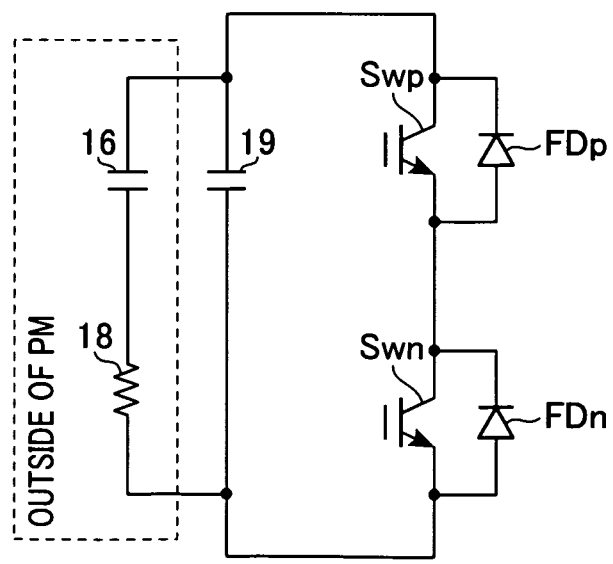

The configuration of the snubber circuit SC is not limited to that exemplified in the above embodiments. For example, as shown in FIG. 20A, the snubber circuit SC may include the capacitor 16 only. Alternatively, as shown in FIG. 20B, a capacitor 19 may be connected to the series-connected unit of the capacitor 16 and the resistor 18 in parallel. According to this configuration, compared with the series-connected unit of the capacitor 16 and the resistor 18, the effect of restricting the voltage fluctuation when changing the switching state can be enhanced. Note that, in FIG. 20B, only the capacitor 19 is included in the power module PM, the series-connected unit of the capacitor 16 and the resistor 18 is attached to the outside of the power module PM. Hence, the series-connected unit of the capacitor 16 and the resistor 18 can be shared between a plurality of the power modules PM (power modules PM configuring the inverter IV). Note that the series-connected unit of the capacitor 16 and the resistor 18 can be included in the power module PM.

The snubber circuits SC of the second to seventh embodiments or the like are not limited to those described above. A diode or the like may be further provided.

In addition, the capacitor 16 configuring the snubber circuit SC and the smoothing capacitors 13, 15 may be the same capacitor.

Regarding the individual snubber circuit SCs:

The individual snubber circuit SC is not limited to the series-connected unit of the capacitor 16 and the resistor 18. For example, a diode may be further provided. In addition, the individual snubber circuit SCs may be a circuit shown in FIG. 13, FIG. 15A or FIG. 16.

Note that the switching element to which the individual snubber circuit SCs is applied is not limited to an IGBT. Specifically, providing the individual snubber circuit SCs is effective for the element, such as a super junction MOSFET, which has the rate of variation in recovery current of a diode.

Regarding the switching elements Swp, Swn:

The switching elements Swp, Swn are not limited to IGBTs formed on a substrate other than the substrate on which a free wheel diode is formed. For example, the switching elements Swp, Swn may be IGBTs formed on the substrate on which a free wheel diode is juxtaposed thereto.

In addition, the MOSFET is not limited to a horizontal device and may be a vertical device.

Regarding the use for the switching elements Swp, Swn:

The switching elements are not limited to configuring a power converter circuit which intermediates the supplying and receiving of electric power between a traction unit and a high-voltage battery. For example, the switching elements may configure a power converter circuit which supplies electric power of the high-voltage battery 12 to a compressor of an in-vehicle air-conditioning unit. Alternatively, the switching elements may configure a DCDC converter which decreases the voltage of the high-voltage battery 12 and outputs the decreased voltage to the low-voltage battery.

In addition, in the converter CV shown in FIG. 1, a step-up copper circuit may be configured by including only the free wheel diode FDp and without including the high-potential-side switching element Swp. In this case, the power module PM includes the series-connected unit in which the low-potential-side switching element Swn, which is the first flowing restriction element, and the free wheel diode FDn are connected to each other in anti-parallel, and the set of the switching element Swn and the free wheel diode FDn is connected to the high-potential-side free wheel diode FDp, which is the second flowing restriction element, in series. However, the high-potential-side switching element Swp is not provided. Note that when the individual snubber circuit SCs is provided in the above configuration, instead of connecting respective individual snubber circuits SCs to the first flowing restriction element and the second flowing restriction element in parallel, for example, the individual snubber circuit SCs may be connected to the second flowing restriction element in parallel.

Other configurations:

In the sixth and seventh embodiments, as in the case of the first embodiment, the conductors 30p, 30n, 40 and the heat sinks 44 and 48 may be provided.

If the heat sinks 44, 48 are not conductors, the insulating films 42, 46 are not necessary. In addition, for example, even when the multilayer board 20 is air-cooled without using the heat sinks 44, 48, the insulating films 42, 46 are not necessary.

Hereinafter, aspects of the above-described embodiments will be summarized.

(1) As an aspect of the embodiment, a switching module is provided which includes: a first series-connected unit of a first flowing restriction element and a second flowing restriction element, the first flowing restriction element having an opening and closing function of opening and closing a flowing path of current, and the second flowing restriction element having at least one of a rectifying function of restricting the direction in which current flows and the opening and closing function; and a snubber circuit connected to the first series-connected unit in parallel, wherein a first wiring line connecting between the first flowing restriction element and the snubber circuit, a second wiring line connecting between the second flowing restriction element and the snubber circuit, a third wiring line connecting between the first flowing restriction element and the second flowing restriction element, the first flowing restriction element, the second flowing restriction element, and the snubber circuit are formed substantially integrally with each other by using an insulator.

When the snubber circuit is provided, the paths, in which current suddenly varies with the opening and closing operation of the first flowing restriction element, can be localized to a loop path formed of the first flowing restriction element, the second flowing restriction element, and the snubber circuit. In the switching module, the loop path can be sufficiently small by integrally forming the members by using insulator. Hence, parasitic inductance can be sufficiently small, the parasitic inductance generating surge due to the sudden variation in current with the opening and closing operation of the first flowing restriction element, whereby the current path, in which the sudden variation in current is caused, can be sufficiently small. Consequently, the generation of radiation noise is restricted.

(2) As another aspect of the embodiment, a switching module is provided which includes: a series-connected unit of a first flowing restriction element and a second flowing restriction element, the first flowing restriction element having an opening and closing function of opening and closing a flowing path of current, and the second flowing restriction element having at least one of a rectifying function of restricting the direction in which current flows and the opening and closing function; and a snubber circuit connected to the series-connected unit in parallel, wherein a first wiring line connecting between the first flowing restriction element and the snubber circuit, a second wiring line connecting between the second flowing restriction element and the snubber circuit, and a third wiring line connecting between the first flowing restriction element and the second flowing restriction element are formed so as to contact an insulator in which the first flowing restriction element and the second flowing restriction element are embedded.

When the snubber circuit is provided, the paths, in which current suddenly varies with the opening and closing operation of the first flowing restriction element, can be localized to a loop path formed of the first flowing restriction element, the second flowing restriction element, and the snubber circuit. In the switching module, the loop path can be sufficiently small when the loop path is formed by contacting the insulator in which the first flowing restriction element and the second flowing restriction element are embedded. Hence, parasitic inductance can be sufficiently small, the parasitic inductance generating surge due to the sudden variation in current with the opening and closing operation of the first flowing restriction element, whereby the current path, in which the sudden variation in current is caused, can be sufficiently small. Consequently, the generation of radiation noise is restricted.

(3) In the switching module according to (1) or (2), a first semiconductor chip configuring the first flowing restriction element and a second semiconductor chip configuring the second flowing restriction element are arranged so as to be opposed to each other, the first wiring line is formed on a side of one of a pair of opposed surfaces of the first semiconductor chip, the surfaces being adjacent to another surface of the first semiconductor chip, the second wiring line is formed on a side of one of a pair of opposed surfaces of the second semiconductor chip, the surfaces being adjacent to another surface of the second semiconductor chip, the another surface of the first semiconductor chip and the another surface of the second semiconductor chip being opposed to each other, and the third wiring line is formed on a side of the other of the pair of the surfaces of the first semiconductor chip and on a side of the other of the pair of the surfaces of the second semiconductor chip.

According to the switching module, the variation in current with the opening and closing operation of the first flowing restriction element can be localized to a current path connecting between the pair of the surfaces.

(4) In the switching module according to (3), the first semiconductor chip configuring the first flowing restriction element and the second semiconductor chip configuring the second flowing restriction element are vertical devices, the opposed surfaces of the first semiconductor chip are both ends of a flowing path of current of the first flowing restriction element, and the opposed surfaces of the second semiconductor chip are both ends of a flowing path of current of the second flowing restriction element.

(5) In the switching module according to (3) or (4), each of the first flowing restriction element and the second flowing restriction element includes a switching element and a free wheel diode connected to the switching element in anti-parallel.

(6) In the switching module according to (4) or (5), the first wiring line and the second wiring line have surface areas larger than areas of the semiconductor chips.

As the surface area of a line becomes large, thermal diffusion from the line is improved. Considering this feature, in the switching module, the surface area of a line is larger than the area of a chip, which can improve the radiating function of a line having an electrical connecting function.

(7) In the switching module according to any one of (4) to (6), the third wiring line has a surface area larger than the sum of an area of the first semiconductor chip configuring the first flowing restriction element and an area of the second semiconductor chip configuring the second flowing restriction element.

As the surface area of a line becomes large, thermal diffusion from a line is improved. Considering this feature, in the switching module, the semiconductor chip can appropriately radiate heat using the line.

(8) In the switching module according to any one of (4) to (7), the heights of the first wiring line and the second wiring line are equal to or more than that of an element configuring the snubber circuit.

According to the switching module, ensuring the height of the line can enhance the effect of diffusing the heat of the semiconductor chip.

(9) In the switching module according to any one of (4) to (8), the first wiring line and the second wiring line are covered with an insulating film, and a heat sink is provided on the back side of a surface of the insulating film, the surface being opposed to the first and second wiring lines.

According to the switching module, providing the heat sink can further enhance the effect of heat radiation from the semiconductor chip.

(10) In the switching module according to any one of (4) to (9), the third wiring line is covered with an insulating film, and a heat sink is provided on the back side of a surface of the insulating film, the surface being opposed to the third wiring line.

According to the switching module, providing the heat sink can further enhance the effect of heat radiation from the semiconductor chip.

(11) In the switching module according to any one of (4) to (10), the first wiring line and the second wiring line are respectively connected to a high-potential-side bus bar and a low-potential-side bus bar, and the third wiring line is connected to a bus bar on the side of a connecting point, and a first magnetic flux generated by a current flowing through a loop circuit configured by the snubber circuit, the first flowing restriction element, and the second flowing restriction element, a second magnetic flux generated by a current flowing between the first wiring line and the third wiring line, and a third magnetic flux generated by a current flowing between the second wiring line and the third wiring line are not parallel to each other.

Regarding the magnetic flux generated by a current flowing through the loop circuit, a component interfering with the magnetic flux generated by a current flowing between the first wiring line and the third wiring line and the magnetic flux generated by a current flowing between the second wiring line and the third wiring line is parallel to the magnetic fluxes. In addition, this component causes noise generated between the first wiring line and the third wiring line or between the second wiring line and the third wiring line. In the switching module, considering the point, the parallel component is reduced.

(12) In the switching module according to (11), the first flowing restriction element includes a switching control terminal into which an instruction for opening and closing the flowing path is inputted, and the direction in which the first wiring line, the second wiring line, and the third wiring line extend to the outside of the insulator and the direction in which a line connected to the switching control terminal extends to the outside of the insulator form an obtuse angle.

According to the switching module, since the pair of the directions forms an obtuse angle, the magnetic field generated by a current flowing between the third wiring line and the first wiring line or between the third wiring line and the second wiring line can be appropriately prevented from affecting the switching control terminal of the first flowing restriction element, which can appropriately prevent the magnetic field from becoming a noise source with the opening and closing operation of the first flowing restriction element.

(13) In the switching module according to (12), the first flowing restriction element further includes a reference potential terminal for determining a reference potential of operation thereof, and the line connected to the switching control terminal and a line connected to the reference potential terminal are formed in the same layer.

According to the switching module, since the pair of the lines is formed in the same layer, the magnetic flux generated by the current flowing through the loop circuit can be prevented from crossing between the pair of the lines, thereby appropriately preventing the first flowing restriction element from malfunctioning by the magnetic flux.

(14) In the switching module according to any one of (4) to (13), the insulator is a multilayer board, and the first semiconductor chip configuring the first flowing restriction element and the second semiconductor chip configuring the second flowing restriction element are formed in the same layer of the multilayer board.

(15) In the switching module according to any one of (1) to (14), the insulator is a multilayer board, the first flowing restriction element includes a switching control terminal into which an instruction for opening and closing the flowing path is inputted, and a line connected to the switching control terminal includes a line of the multilayer board.

(16) In the switching module according to any one of (1) to (15), the insulator is a multilayer board, and the first wiring line, the second wiring line, and the third wiring line include a line of the multilayer board.

According to the switching module, providing the line of the multilayer board can make further small the loop path formed of the first flowing restriction element, the second flowing restriction element, and the snubber circuit. In addition, since the surface area of the line can easily be adjusted, for example, the above configurations (6)(7) can easily be realized.

(17) In the switching module according to any one of (14) to (16), a side surface of the multilayer board is covered with molding material.

According to the switching module, providing the molding material can increase the stiffness of the module and increase the insulating properties.

(18) In the switching module according to any one of (1) to (13), the insulator is a molding material covering the first flowing restriction element and the second flowing restriction element.

(19) In the switching module according to any one of (1) to (18), the snubber circuit includes a capacitor connected to the first series-connected unit in parallel, and a rectifying unit configuring a charging path of the capacitor, and the rectifying unit is connected to a discharging path of the capacitor in parallel, the capacitor having impedance larger than that of the charging path.

According to the switching module, when the polarity of the voltage generated in the parasitic inductance of the line connected between the first wiring line and the second wiring line by the opening and closing operation of the flowing restriction element increases the voltage across the flowing restriction element, variation in current of the parasitic inductance can be restricted by charging the capacitor. Thereafter, when discharging from the capacitor, the discharging rate can be limited by using the discharging path. Hence, variation in current due to the discharge can be restricted.

(20) In the switching module according to (19), in the rectifying unit, on-resistance is set by which an actual charging rate becomes larger than a charging rate of the capacitor determined by a resonance frequency according to parasitic inductance of a bus bar connected to the first wiring line and capacitance of the capacitor.

When the impedance of the charging path is excessively low, the resonance phenomenon between the parasitic inductance and the capacitor becomes obvious. Considering this feature, in the switching module, setting the on-resistance can appropriately restrict the resonance phenomenon between the parasitic inductance and the capacitor. Hence, the transient state with the opening and closing operation of the flowing restriction element can appropriately converge.

(21) In the switching module according to (19), the charging path is provided with a resistor.

When the impedance of the charging path is excessively low, the resonance phenomenon between the parasitic inductance and the capacitor becomes obvious. Considering this feature, in the switching module, providing the charging path with the resistor can appropriately restrict the resonance phenomenon between the parasitic inductance and the capacitor. Hence, the transient state with the opening and closing operation of the flowing restriction element can appropriately converge.

(22) In the switching module according to (20), the discharging path includes a resistor, and the resistor of the charging path is a part of the resistor of the discharging path.

(23) In the switching module according to any one of (1) to (18), the snubber circuit includes a capacitor connected to the first series-connected unit in parallel.

(24) In the switching module according to any one of (1) to (18), the snubber circuit includes a second series-connected unit of a resistor and a capacitor connected to the first series-connected unit in parallel.

(25) In the switching module according to any one of (1) to (18), the snubber circuit includes a second series-connected unit of a resistor and a capacitor connected to the first series-connected unit in parallel, and a capacitor connected to the second series-connected unit in parallel.

According to the switching module, compared with the configuration in which the snubber circuit is formed of only the series-connected unit of the capacitor and the resistor, the voltage fluctuation with the opening and closing operation of the first flowing restriction element can be reduced.

(26) In the switching module according to any one of (1) to (18), the first series-connected unit is connected to a snubber circuit in parallel, the snubber circuit including a second series-connected unit of a resistor and a capacitor, the second series-connected unit being connected to the first series-connected unit in parallel, and a capacitor connected to the second series-connected unit in parallel, and the switching module includes only the capacitor connected to the second series-connected unit in parallel.

(27) In the switching module according to any one of (1) to (26), the snubber circuit includes a plurality of capacitors connected to each other in parallel.

When using a capacitor having a large surface area to ensure the capacitance thereof, the stress due to temperature change becomes great. Meanwhile, when the capacitor is detached from the insulator to reduce the influence of the variation in temperature, the effect of forming the current path into a short loop is reduced. Considering this point, in the switching module, employing the plurality of capacitors connected to each other in parallel in the snubber circuit can appropriately form the current path into a short loop while ensuring the capacitance.

(28) The switching module according to any one of (1) to (27) further includes at least one of an individual snubber circuit connected across the first flowing restriction element and an individual snubber circuit connected across the second flowing restriction element, and wherein at least one line connecting between the at least one of the individual snubber circuits and the at least one of the flowing restriction elements contacts the insulator.

According to the switching module, providing the individual snubber circuit can appropriately reduce the surge. In addition, forming the line connecting between the individual snubber circuit and the flowing restriction element so as to contact the insulator can form the loop path between the individual snubber circuit and the flowing restriction element into a short loop.

(29) In the switching module according to (28), the individual snubber circuits include a series-connected unit of a resistor and a capacitor.

(30) In the switching module according to (28) or (29), the individual snubber circuits include a plurality of capacitors connected to each other in parallel.

When using a capacitor having a large surface area to ensure the capacitance thereof, the stress due to temperature change becomes great. Meanwhile, when the capacitor is detached from the insulator to reduce the influence of the variation in temperature, the effect of forming the current path into a short loop is reduced. Considering this point, in the switching module, employing the plurality of capacitors connected to each other in parallel in the snubber circuit can appropriately form the current path into a short loop while ensuring the capacitance.

It will be appreciated that the present invention is not limited to the configurations described above, but any and all modifications, variations or equivalents, which may occur to those who are skilled in the art, should be considered to fall within the scope of the present invention.

What is claimed is:

1. A switching module, comprising:
a series-connected unit of a low-potential-side flowing restriction element and a high-potential-side flowing restriction element, the low-potential-side flowing restriction element having an opening and closing function of opening and closing a flowing path of current, and the high-potential-side flowing restriction element having at least one of a rectifying function of restricting the direction in which current flows and the opening and closing function; and
a snubber circuit connected to the series-connected unit in parallel, wherein
a low-potential-side wiring line connecting between the low-potential-side flowing restriction element and the snubber circuit, a high-potential-side wiring line connecting between the high-potential-side flowing restriction element and the snubber circuit, an intermediate wiring line connecting between the low-potential-side flowing restriction element and the high-potential-side flowing restriction element, the low-potential-side flowing restriction element, the high-potential-side flowing restriction element, and the snubber circuit are formed substantially integrally with each other by using a multilayer board,
a low-potential-side semiconductor chip configuring the low-potential-side flowing restriction element and a high-potential-side semiconductor chip configuring the high-potential-side flowing restriction element are arranged so as to be opposed to each other,
the low-potential-side wiring line is formed on a side of one of a pair of opposed surfaces of the low-potential-side semiconductor chip, the surfaces being adjacent to another surface of the low-potential-side semiconductor chip,
the high potential-side wiring line is formed on a side of one of a pair of opposed surfaces of the high-potential-side semiconductor chip, the surfaces being adjacent to another surface of the high-potential-side semiconductor chip, the another surface of the low-potential-side semiconductor chip and the another surface of the high-potential-side semiconductor chip being opposed to each other,
the intermediate wiring line is formed on a side of the other of the pair of the surfaces of the low-potential-side semiconductor chip and on a side of the other of the pair of the surfaces of the high-potential-side semiconductor chip,
the low-potential-side semiconductor chip configuring the low-potential-side flowing restriction element and the high-potential-side semiconductor chip configuring the high-potential-side flowing restriction element are formed in the same layer of the multilayer board,
a first current path between the snubber circuit and the high-potential-side semiconductor chip is opposed to a second current path between the high-potential-side semiconductor chip and the intermediate wiring line, and the directions in which currents flow in the first and second current paths are opposite to each other, and
a third current path between the snubber circuit and the low-potential-side semiconductor chip is opposed to a fourth current path between the low-potential-side semiconductor chip and the intermediate wiring line, and the directions in which currents flow the third and fourth current paths are opposite to each other.

2. The switching module according to claim 1, wherein the low-potential-side semiconductor chip configuring the low-potential-side flowing restriction element and the high-potential-side semiconductor chip configuring the high-potential-side flowing restriction element are vertical devices,
the opposed surfaces of the low-potential-side semiconductor chip are both ends of a flowing path of current of the low-potential-side flowing restriction element, and
the opposed surfaces of the high-potential-side semiconductor chip are both ends of a flowing path of current of the high-potential-side flowing restriction element.

3. The switching module according to claim 1, wherein each of the low-potential-side flowing restriction element and the high-potential-side flowing restriction element includes a switching element and a free wheel diode connected to the switching element in anti-parallel.

4. The switching module according to claim 2, wherein the low-potential-side wiring line and the high-potential-side wiring line have surface areas larger than areas of the semiconductor chips.

5. The switching module according to claim 2, wherein the intermediate wiring line has a surface area larger than the sum of an area of the low-potential-side semiconductor chip configuring the low-potential-side flowing restriction element and an area of the high-potential-side semiconductor chip configuring the high-potential-side flowing restriction element.

6. The switching module according to claim 2, wherein the heights of the low-potential-side wiring line and the high-potential-side wiring line are equal to or more than that of an element configuring the snubber circuit.

7. The switching module according to claim 2, wherein the low-potential-side wiring line and the high-potential-side wiring line are covered with an insulating film, and
a heat sink is provided on the back side of a surface of the insulating film, the surface being opposed to the low-potential-side and the high-potential-side wiring lines.

8. The switching module according to claim 2, wherein the intermediate wiring line is covered with an insulating film, and
a heat sink is provided on the back side of a surface of the insulating film, the surface being opposed to the intermediate wiring line.

9. The switching module according to claim 2, wherein the high-potential-side wiring line and the low-potential-side wiring line are respectively connected to a high-potential-side bus bar and a low-potential-side bus bar, and the intermediate wiring line is connected to a bus bar on the side of a connecting point, and
a first magnetic flux generated by a current flowing through a loop circuit configured by the snubber circuit, the low-potential-side flowing restriction element, and the high-potential-side flowing restriction element, a second magnetic flux generated by a current flowing between the low-potential-side wiring line and the intermediate wiring line, and a third magnetic flux generated by a current flowing between the high-potential-side wiring line and the intermediate wiring line are not parallel to each other.

10. The switching module according to claim 9, wherein
the low-potential-side flowing restriction element includes
a switching control terminal into which an instruction for opening and closing the flowing path is inputted, and
the direction in which the low-potential-side wiring line, the high-potential-side wiring line, and the intermediate wiring line extend to the outside of the insulator and the direction in which a line connected to the switching control terminal extends to the outside of the insulator form an obtuse angle.

11. The switching module according to claim 10, wherein
the low-potential-side flowing restriction element further includes a reference potential terminal for determining a reference potential of operation thereof, and
the line connected to the switching control terminal and a line connected to the reference potential terminal are formed in the same layer.

12. The switching module according to claim 1, wherein
the low-potential-side flowing restriction element includes
a switching control terminal into which an instruction for opening and closing the flowing path is inputted, and
a line connected to the switching control terminal includes a line of the multilayer board.

13. The switching module according to claim 1, wherein
the low-potential-side wiring line, the high-potential-side wiring line, and the intermediate wiring line include a line of the multilayer board.

14. The switching module according to claim 1, wherein
a side surface of the multilayer board is covered with molding material.

15. The switching module according to claim 1, wherein
the snubber circuit includes a capacitor connected to the series-connected unit in parallel, and a rectifying unit configuring a charging path of the capacitor, and
the rectifying unit is connected to a discharging path of the capacitor in parallel, the capacitor having impedance larger than that of the charging path.

16. The switching module according to claim 15, wherein
in the rectifying unit, on-resistance is set by which an actual charging rate becomes larger than a charging rate of the capacitor determined by a resonance frequency according to parasitic inductance of a bus bar connected to the low-potential-side wiring line and capacitance of the capacitor.

\* \* \* \* \*